United States Patent
Kobayashi

(10) Patent No.: US 10,139,931 B2
(45) Date of Patent: Nov. 27, 2018

(54) INPUT ASSISTANCE DEVICE AND INPUT SYSTEM

(71) Applicant: Alps Electric Co., Ltd., Ota-ku, Tokyo (JP)

(72) Inventor: Ayumu Kobayashi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 15/730,309

(22) Filed: Oct. 11, 2017

(65) Prior Publication Data
US 2018/0046267 A1 Feb. 15, 2018

Related U.S. Application Data

(63) Continuation of application No. PCT/JP2016/059419, filed on Mar. 24, 2016.

(51) Int. Cl.
| | |
|---|---|
| *H03M 11/00* | (2006.01) |
| *H03K 17/94* | (2006.01) |
| *G07C 9/00* | (2006.01) |
| *G09G 5/00* | (2006.01) |
| *H04M 1/00* | (2006.01) |
| *H04M 3/00* | (2006.01) |
| *G06F 17/00* | (2006.01) |
| *G06F 19/00* | (2018.01) |
| *G06F 3/0487* | (2013.01) |

(Continued)

(52) U.S. Cl.
CPC ............ *G06F 3/0362* (2013.01); *G06F 3/023* (2013.01); *G06F 3/03* (2013.01); *G06F 3/041* (2013.01); *G06F 3/044* (2013.01); *H03M 11/14* (2013.01)

(58) Field of Classification Search
None
See application file for complete search history.

(56) References Cited

U.S. PATENT DOCUMENTS

| | | | | |
|---|---|---|---|---|
| 6,606,085 | B1 * | 8/2003 | Endo | G05G 9/04796 345/159 |
| 7,417,422 | B2 * | 8/2008 | Kang | G06F 3/016 324/207.2 |

(Continued)

FOREIGN PATENT DOCUMENTS

| | | | | |
|---|---|---|---|---|
| DE | 102009010799 | * | 9/2010 | ............ B60K 37/06 |
| JP | 2012-35782 | | 2/2012 | |

(Continued)

OTHER PUBLICATIONS

International Search Report from International Application No. PCT/JP2016/059419 dated May 10, 2016.

*Primary Examiner* — Steven Lim
*Assistant Examiner* — Muhammad Adnan
(74) *Attorney, Agent, or Firm* — Beyer Law Group LLP

(57) ABSTRACT

An input assistance device has a rotation support body having a central axis, an attachment mechanism that removably attaches the rotation support body to the panel surface of a sensor panel so that the central axis is along a direction perpendicular to the panel surface, and a rotational part supported by the rotation support body so as to be rotatable around the central axis. At least the side surface of the rotational part is formed from a conductive material. Conductive areas electrically connected to the side surface are allocated in part of a surface of the rotational part, the surface facing the panel surface.

15 Claims, 13 Drawing Sheets

(51) Int. Cl.
  *G06F 3/01*     (2006.01)
  *G06F 3/02*     (2006.01)
  *G06F 3/0362*   (2013.01)
  *G06F 3/023*    (2006.01)
  *G06F 3/03*     (2006.01)
  *G06F 3/041*    (2006.01)
  *G06F 3/044*    (2006.01)
  *H03M 11/14*    (2006.01)

(56) References Cited

U.S. PATENT DOCUMENTS

| | | | | |
|---|---|---|---|---|
| 7,425,825 B2 * | 9/2008 | Kang | | G01D 5/145 |
| | | | | 324/207.2 |
| 7,468,603 B2 * | 12/2008 | Kang | | G06F 3/0362 |
| | | | | 324/207.2 |
| 8,138,865 B2 * | 3/2012 | North | | G06F 3/0362 |
| | | | | 324/151 R |
| 8,305,242 B2 * | 11/2012 | Yamasaki | | G06F 3/0338 |
| | | | | 341/32 |
| 8,659,402 B2 * | 2/2014 | Wakita | | G06F 3/016 |
| | | | | 340/407.1 |
| 8,884,933 B2 * | 11/2014 | Yokoyama | | G06F 3/03547 |
| | | | | 200/179 |
| 9,035,873 B2 * | 5/2015 | Takahata | | G06F 3/0362 |
| | | | | 345/156 |
| 9,182,825 B2 * | 11/2015 | Schneider | | G06F 3/041 |
| 9,291,259 B2 * | 3/2016 | Watanabe | | F16H 59/08 |
| 9,862,099 B1 * | 1/2018 | Linnell | | G06F 3/016 |
| 2002/0145587 A1 * | 10/2002 | Watanabe | | G06F 3/018 |
| | | | | 345/156 |
| 2004/0052016 A1 * | 3/2004 | Takagi | | G05G 1/10 |
| | | | | 361/51 |
| 2006/0081452 A1 * | 4/2006 | Yanai | | H01H 13/14 |
| | | | | 200/406 |
| 2006/0283286 A1 * | 12/2006 | Maeda | | B60K 37/06 |
| | | | | 74/553 |
| 2009/0009491 A1 * | 1/2009 | Grivna | | G06F 3/033 |
| | | | | 345/184 |
| 2009/0107287 A1 * | 4/2009 | Seki | | B60K 37/06 |
| | | | | 74/504 |
| 2013/0038549 A1 | 2/2013 | Kitada et al. | | |
| 2013/0245835 A1 * | 9/2013 | Watanabe | | G06F 3/033 |
| | | | | 700/275 |
| 2014/0345409 A1 * | 11/2014 | Watanabe | | F16H 59/08 |
| | | | | 74/473.3 |
| 2016/0293361 A1 * | 10/2016 | Osako | | H01H 13/52 |

FOREIGN PATENT DOCUMENTS

| | | |
|---|---|---|
| JP | 2013-41320 | 2/2013 |
| JP | 2013-178678 | 9/2013 |
| JP | 2014-194824 | 10/2014 |
| WO | 2012/162112 | 11/2012 |

* cited by examiner

INPUT ASSISTANCE DEVICE AND INPUT SYSTEM

CLAIM OF PRIORITY

This application is a Continuation of International Application No. PCT/JP2016/059419 filed on Mar. 24, 2016, which claims benefit of Japanese Patent Application No. 2015-088533 filed on Apr. 23, 2015. The entire contents of each application noted above are hereby incorporated by reference.

BACKGROUND OF THE INVENTION

1. Field of the Invention

The present invention relates to an input assistance device with which an input to a sensor panel by a rotational operation is possible and to an input system that has this type of input assistance device.

2. Description of the Related Art

In an input in which a touch panel is used, a manipulator may touch a wrong place because a panel surface is even and a click feeling is not thereby obtained. In contrast to this, a structure is proposed that enables the manipulator to obtain a click feeling by placing a detachable button-type input sheet that covers part of a panel surface and operating buttons on this button-type input sheet to make an input (Japanese Unexamined Patent Application Publication No. 2014-194824, for example).

SUMMARY OF THE INVENTION

In an input using a touch panel, however, there is a case in which an input involving a continuous operation such as a rotational input is necessary, besides an input in which a button is pressed. A button-type input sheet as described above cannot cope with this type of input. When an input is directly made on a touch panel without using a button-type input sheet, it has been difficult to accurately make an input through a necessary operation path.

The present invention provides an input assistance device with which an input can be accurately made through a necessary path when an input involving a continuous operation such as a rotational input is necessary, as well as an input system having the input assistance device. The present invention also provides an input assistance device with which a rotational input is possible and that can be detachably attached at an arbitrary position on a panel surface as well as an input system having the input assistance device.

To solve the above problem, an input assistance device according to the present invention is characterized by having a rotation support body having a central axis, an attachment mechanism that removably attaches the rotation support body to the panel surface of a sensor panel so that the central axis is along a direction perpendicular to the panel surface, and a rotational part supported by the rotation support body so as to be rotatable around the central axis; at least the side surface of the rotational part is formed from a conductive material, and a conductive area electrically connected to the side surface is allocated in part of a surface of the rotational part, the surface facing the panel surface.

Accordingly, the input assistance device can be removably attached at a desired position on the panel surface, and an input manipulation can be performed by rotationally manipulating the rotational part at that position. Since the rotation support body is attached to the panel surface and the rotational part rotates around the rotation support body, an input can be accurately made through a fixed path.

An input assistance device in a first aspect is characterized in that the attachment mechanism is preferably a suction cup disposed on a surface of the rotation support body, the surface facing the panel surface, and that the suction cup preferably adheres to the panel surface when the rotation support body is pressed against the panel surface along the direction of the central axis.

Accordingly, the input assistance device can be easily detached from the panel surface, and when attached to the panel surface, the input assistance device can be reliably held.

The input assistance device in the first aspect preferably has a pressing manipulation body and an elastic member that gives an elastic force to the pressing manipulation body in a direction away from the panel surface; the pressing manipulation body preferably has a manipulation part, at least the front surface of the manipulation part being formed from a conductive material, and also preferably has an axial part extending from the manipulation part along the central axis; an electrical connection is preferably made from the front surface of the manipulation part to the top of the axial part; while the manipulation part is not being manipulated, the top of the axial part and the panel surface are preferably separated from each other by the elastic force by a predetermined distance, and when the manipulation part is pressed toward the panel surface along the central axis, the distance between the top of the axial part and the panel surface preferably becomes shorter the predetermined distance and the top preferably comes close to the panel surface or comes into contact with it.

Accordingly, in addition to a manipulation using the rotational part, it is possible to perform a manipulation by displacing the pressing manipulation body along the axial part.

In the input assistance device in the first aspect, it is also preferably possible to use the pressing manipulation body as the rotation support body and to use a suction cup provided at the top of the axial part as the attachment mechanism so that when the pressing manipulation body is pressed against the panel surface along the direction of the central axis, the suction cup adheres to the panel surface.

Accordingly, since it is possible to make the pressing manipulation body function as the rotation support body, a simple structure with a reduced number of parts can be achieved.

An input assistance device in a second aspect is characterized in that: the attachment mechanism preferably has a support member attached to the panel surface and a base member supported so as to be movable on the support member; the rotation support body is preferably a bearing circular ring part that can be fixed to and removed from the base member by a fixing part; the rotational part preferably has a rotational manipulation part rotatable around the central axis, at least the side surface of the rotational part being formed from a conductive material, a joining axial part that extends from the rotational manipulation part along the central axis, the joining axial part being rotatably supported by the bearing circular ring part, and a rotational top part provided at the top of the joining axial part, the rotational top part being placed so as to face the panel surface; and a conductive area is preferably allocated in part of a surface at the rotational top part, the surface facing the panel surface, the conductive area being electrically connected to the side surface of the rotational manipulation part.

Since the rotational part is moved forward, backward, leftward, and rightward by displacing the base member and bearing circular ring part in a state in which the base member is supported by the support member, the rotational part can be easily and accurately moved and the input assistance device can be removably attached at a desired position on the panel surface.

An input system in the present invention is characterized by having an input device that makes an input according to a manipulation made for a sensor panel and any one of the input assistance devices described above.

Accordingly, in addition to an input manipulation performed when a finger of the manipulator is brought into contact with the panel surface or brought close to it, an input resulting from a rotational manipulation in which the input assistance device is used can be made. The input assistance device can be removably attached at a desired position on the panel surface. In addition, since the rotation support body is attached to the panel surface and the rotational part rotates around the rotation support body, an input can be accurately made through a fixed path.

In the input system in the present invention, a plurality of conductive areas are preferably provided on the circumference of a circle centered at the central axis, and the input device preferably has a position calculation unit that calculates the positions of the plurality of conductive areas according to results of detection by the sensor panel and also preferably has a central position calculation unit that calculates the position of the central axis according to a result of calculation by the position calculation unit.

Accordingly, since the attachment position and attachment range of the input assistance device can be identified, it is possible to have the manipulator perform an input manipulation in correspondence to the position and range. Furthermore, since an image corresponding to the attachment position can be displayed, this can contribute to convenience to an input by the manipulator. It is also possible to determine, from the placement of the detection electrode and other conditions, whether the input assistance device is attached at an appropriate position and to notify the manipulator of the result of the determination.

In the input system in the present invention, the input device preferably has an image processing unit that changes an image to be displayed, according to the calculated position of the central axis.

Accordingly, since an image corresponding to the attachment position can be displayed, this can contribute to convenience to an input by the manipulator. It is also possible to determine whether the input assistance device is attached at an appropriate position and to notify the manipulator of the result of the determination as an image.

In the input system in the present invention, the input assistance device is preferably formed from transparent materials.

Accordingly, since the image displayed on the sensor panel passes through the members constituting the input assistance device, it is possible to make an image displayed on the panel surface visible to the manipulator through these members.

According to the present invention, an input assistance device can be detachably attached at an arbitrary position on a panel surface, the input assistance device enabling an input to be accurately made through a necessary path when an input involving a continuous operation such as a rotational input is necessary and also enabling a rotational input.

DESCRIPTION OF THE PREFERRED EMBODIMENTS

An input assistance device and input system according an embodiment of the present invention will be described in detail with reference to the drawings.

First Embodiment

Figure 1:
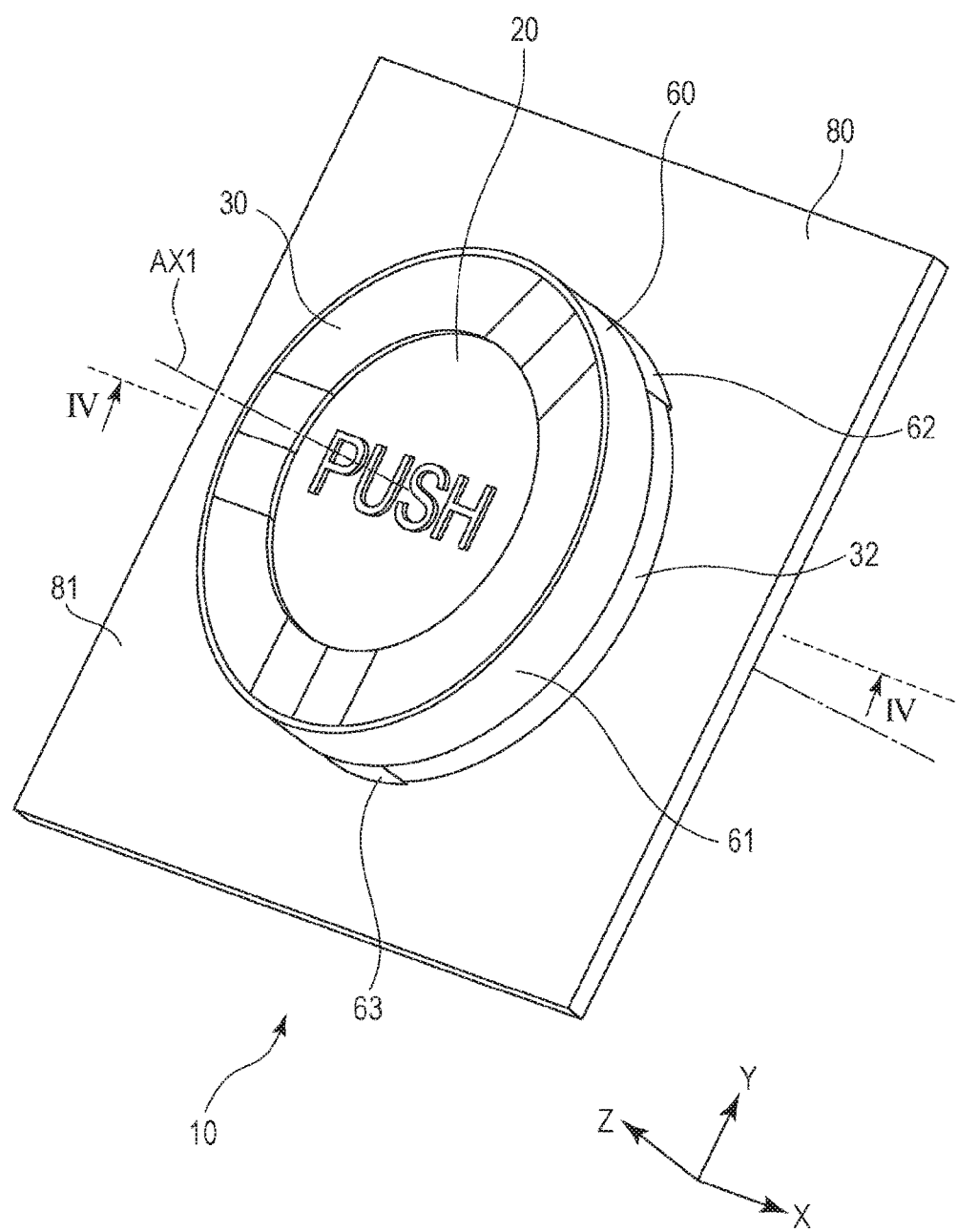
FIG. 1 is a perspective view illustrating the structure of an input system according to a first embodiment of the present invention.
Figure 2:
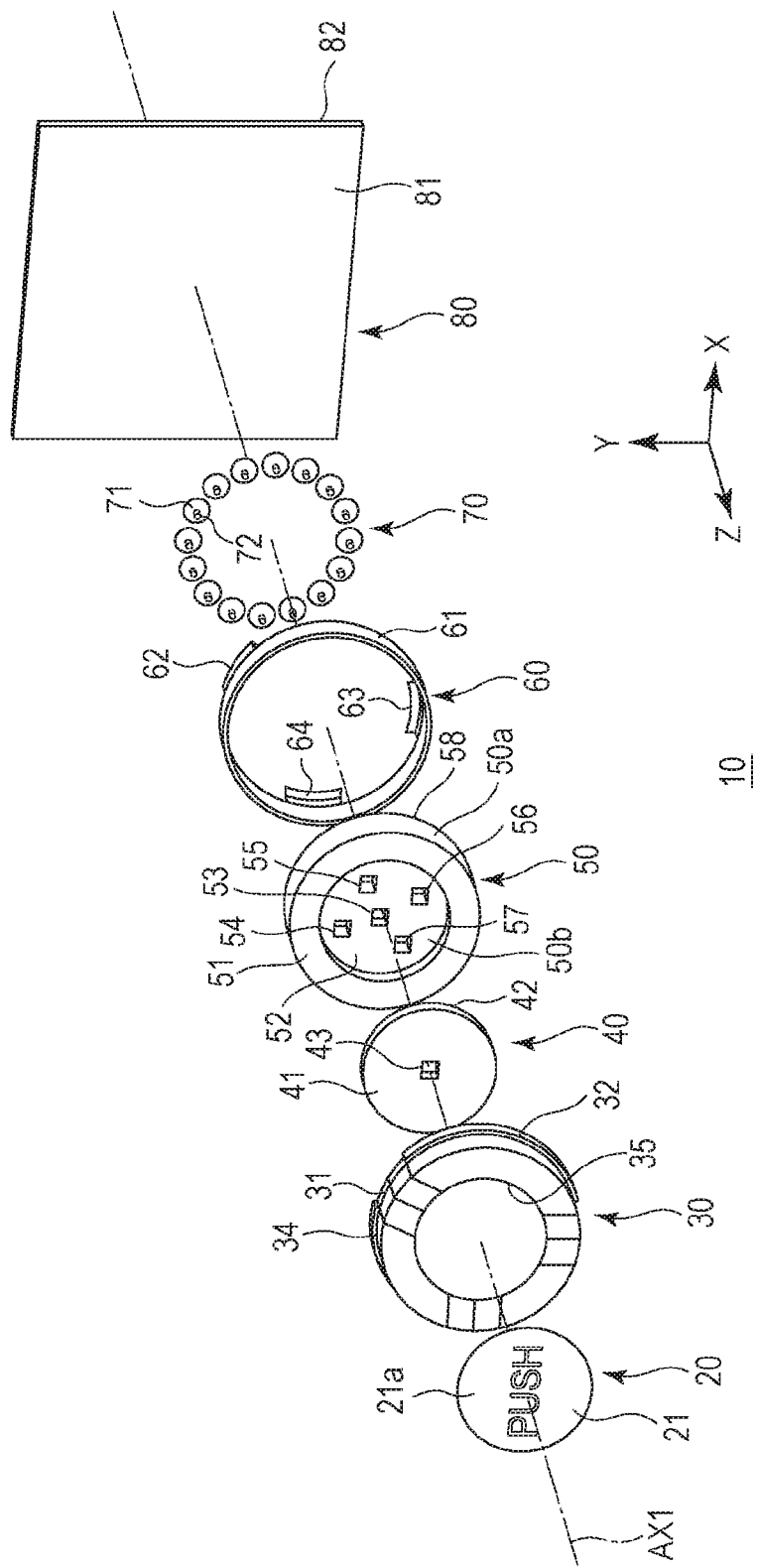
FIG. 2 is an exploded perspective view illustrating the structure of the input system according to the first embodiment, as viewed from the front surface side of the manipulation part of a pressing manipulation body in the Z direction.
Figure 3:
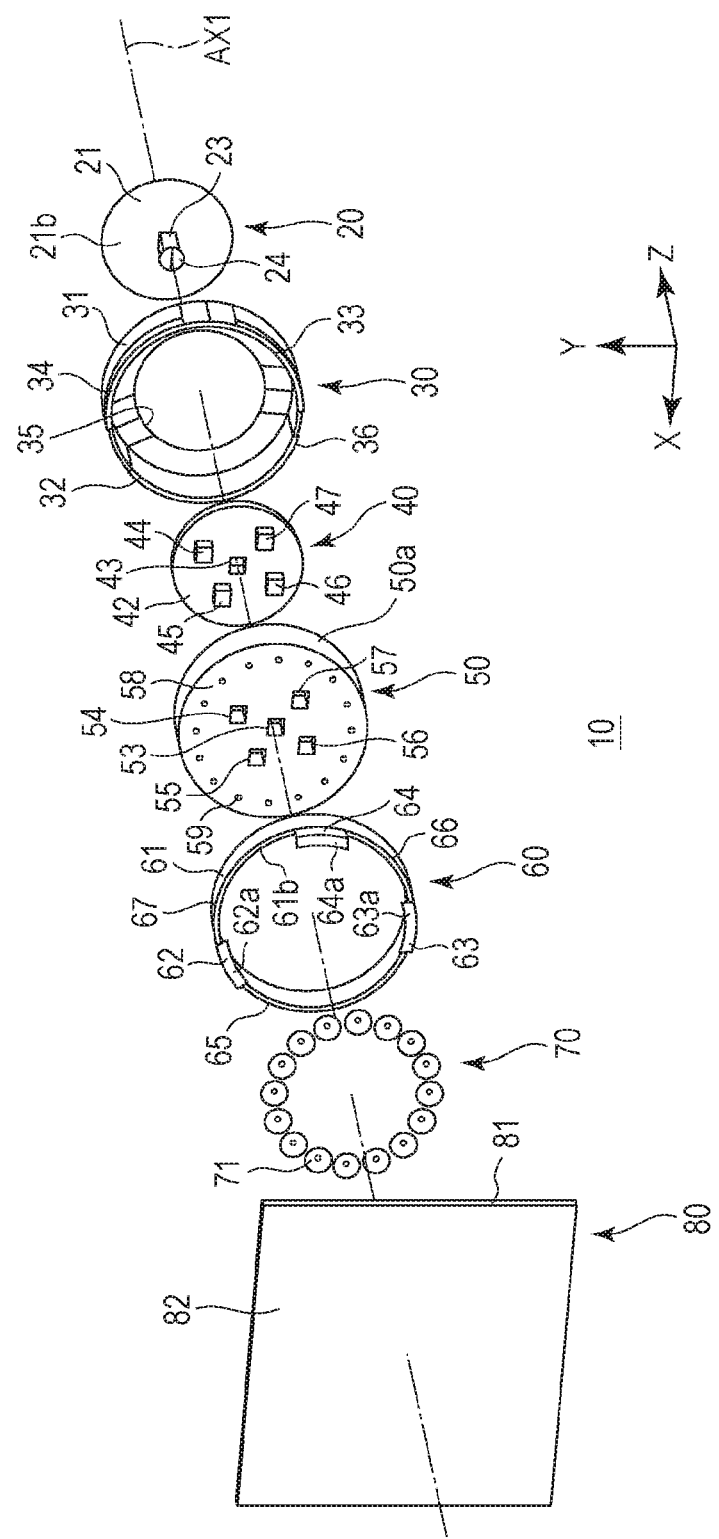
FIG. 3 is an exploded perspective view illustrating the structure of the input system according to the first embodiment, as viewed from the rear surface side of a sensor panel in the Z direction.
Figure 4:
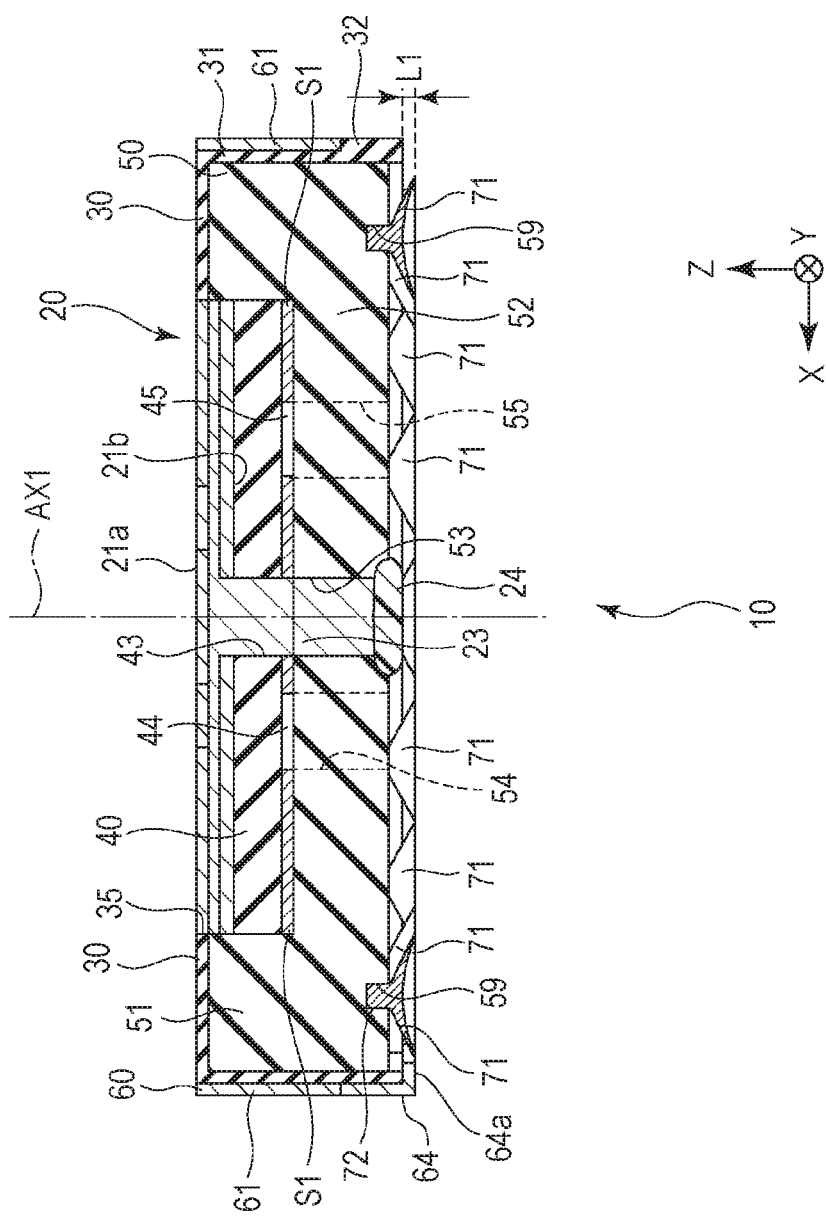
FIG. 4 is a cross-sectional view taken along line IV-IV in FIG. 1.
Figure 5:
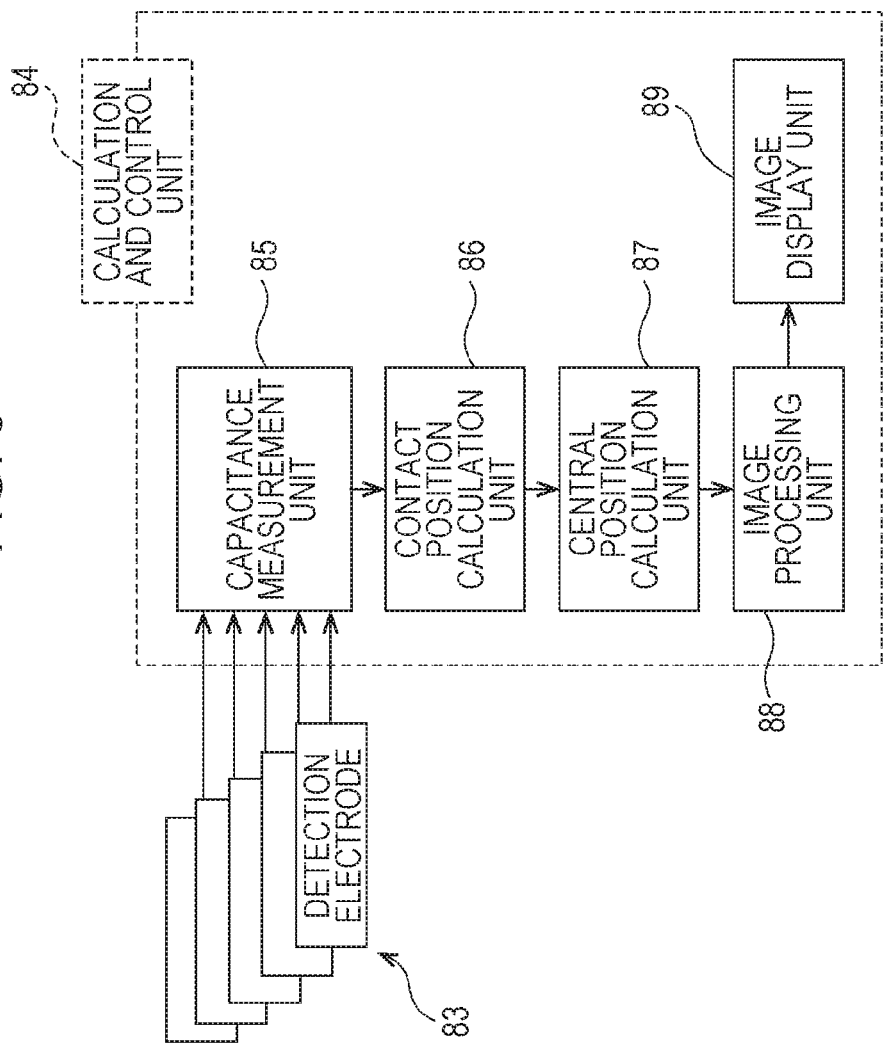
FIG. 5 is a block diagram illustrating the structure of part of an input device in the first embodiment.

FIG. 1 is a perspective view illustrating the structure of an input system 10 according to a first embodiment. FIGS. 2 and 3 are each an exploded perspective view illustrating the structure of the input system 10; FIG. 2 is a drawing as viewed from the same side as the front surface 21a of the manipulation part 21 of a pressing manipulation body 20 in the Z direction, and FIG. 3 is a drawing as viewed from the same side as the rear surface 82 of a sensor panel 80 in the Z direction. FIG. 4 is a cross-sectional view taken along line IV-IV in FIG. 1. FIG. 5 is a block diagram illustrating the structure of part of an input device in the first embodiment. In FIGS. 2 and 3, an elastic member S1 is not illustrated. In FIG. 4, a sensor panel 80 is not illustrated.

In each drawing, an X-Y-Z coordinate system is indicated as a basic coordinate system. The Z direction is along a direction in which the central axis AX1 of the input assistance device extends, and the X-Y plane is orthogonal to the Z direction. The input assistance device is composed of the pressing manipulation body 20, a holding member 30, an intermediate member 40, the elastic member S1 (FIG. 4), a fixing part 50 used as a rotation support body, a rotational part 60, and a suction cup part 70, which is preferably used as an attachment mechanism; these components are all included in the input system 10. In the description below, a state viewed from the forward side along the Z direction may be referred to as a plan view. The forward side in the Z direction is a side on which coordinate values in the Z direction (Z axis) become larger. In the example in FIG. 2, the forward side is on the same side as the front surface 21a of the manipulation part 21, and the backward side is the same side as the rear surface 82 of the sensor panel 80.

As illustrated in FIG. 1, 2, or 3, the input system 10 has the pressing manipulation body 20, the holding member 30, the intermediate member 40, the elastic member S1 (see FIG. 4), the fixing part 50, the rotational part 60, the suction cup part 70, and the input device (see FIG. 5) having the sensor panel 80. These members are sequentially placed along the central axis AX1 of the input assistance device so that their central axes match the central axis AX1 of the input assistance device, as illustrated in FIGS. 2 and 3.

The pressing manipulation body 20 preferably has the manipulation part 21, which is circular in a plan view, and is placed so that the central axis of the pressing manipulation body 20 matches the central axis AX1 of the input assistance device. The pressing manipulation body 20 preferably has an axial part 23 extending backward in the Z direction from the center of the rear surface 21b of the manipulation part 21 in a circular plate shape. At the top of the axial part 23, a contact body 24 having elasticity is provided. The pressing manipulation body 20 is preferably formed from a metal or another conductive body. Since the contact body 24 is made of a conductive resin or the like, the contact body 24 has both conductivity and elasticity. When an external force is not applied to the contact body 24, it maintains a predetermined outer diameter larger than the outer diameter of the axial part 23. When an external force that compresses the contact body 24 is applied to it, the contact body 24 can be contracted due to its elasticity at least until its outer diameter becomes equal to the outer diameter of the axial part 23.

The holding member 30, which is in a circular ring shape, is placed so that the central axis of the holding member 30 matches the central axis AX1 of the input assistance device. Engaging convex parts 32, 33, and 34, protruding outward in the radial direction are provided on the outer circumferential surface 31 of the holding member 30 at intervals of a predetermined angle around the central axis of the holding member 30. The inner circumferential surface 35 of the holding member 30 has a diameter large enough for the pressing manipulation body 20 and intermediate member 40 to be movable in the holding member 30 in the Z direction. The holding member 30 is formed from an elastically deformable insulative material such as, for example, a resin.

The intermediate member 40, which is circular in a plan view, is placed so that the central axis of the intermediate member 40 matches the central axis AX1 of the input assistance device. At the central position of the intermediate member 40, a though-hole 43, passing from a front surface 41 to a rear surface 42, is formed. This though-hole 43 has an inner diameter corresponding to the outer diameter of the axial part 23 of the pressing manipulation body 20. When the axial part 23 of the pressing manipulation body 20 is inserted into the though-hole 43 in the Z direction, the contact body 24 is contracted by stress generated from the inner surface of the though-hole 43, so the contact body 24 is also passed through the though-hole 43 together with the axial part 23.

The intermediate member 40 is formed from an insulative material such as, for example, a resin.

As illustrated in FIG. 3, fitting convex parts 44, 45, 46, and 47, protruding toward the backward side in the Z direction are provided on the rear surface 42 of the intermediate member 40 at intervals of a predetermined angle around the central axis of the intermediate member 40. As illustrated in FIG. 4, on the rear surface 42 of the intermediate member 40, the elastic member S1 in a film shape is placed in a range in which the fitting convex parts 44, 45, 46, and 47 are not provided. The elastic member S1, which is composed of, for example, a rubber member or compression spring, is fixed to the rear surface 42 of the intermediate member 40 with an adhesive or the like in a state in which the elastic member S1 is deformable. The elastic member S1 preferably urges the pressing manipulation body 20 in a direction away from a panel surface 81 along the Z direction. The intermediate member 40 has the same outer diameter as the manipulation part 21 of the pressing manipulation body 20.

The fixing part 50 has a cylindrical shape forming a circle in a plan view. The fixing part 50 is placed so that its central axis matches the central axis AX1 of the input assistance device. The fixing part 50 is formed from an insulative material, which is, for example, a resin. The fixing part 50 has an outer edge part 51 in a circular ring shape and also has a central concave part 52, formed inside the outer edge part 51, in a substantially circular shape in a plan view. The central concave part 52 is formed so that its thickness in the Z direction is smaller than that of the outer edge part 51 and the diameter of the central concave part 52 is equal to the outer diameter of the intermediate member 40. A throughhole 53 extending in the Z direction is formed at the center of the fixing part 50 in the radial direction. This through-hole 53 has the same inner diameter as the though-hole 43 in the intermediate member 40. When the axial part 23 of the pressing manipulation body 20 is inserted into the throughhole 53 in the Z direction, the contact body 24 is contracted by stress generated from the inner surface of the throughhole 53, so the contact body 24 is also inserted into the through-hole 53 together with the axial part 23. After having been inserted from the front surface 41 of the intermediate member 40 into the though-hole 43, the contact body 24 is further inserted into the through-hole 53 in the fixing part 50, and protrudes through a rear surface 58 to the outside. Since an external force is not applied to the contact body 24 in this state, the outer diameter of the contact body 24 is increased due to its elasticity, preventing the contact body 24 from coming off.

Fitting holes 54, 55, 56, and 57, penetrating in the Z direction, are provided in the central concave part 52 at intervals of a predetermined angle around the central axis of the fixing part 50. The fitting holes 54, 55, 56, and 57 are respectively disposed at positions corresponding to the fitting convex parts 44, 45, 46, and 47 of the intermediate member 40. Each fitting hole is shaped so that the corresponding fitting convex part of the intermediate member 40 fits to the interior of the fitting hole. As illustrated in FIG. 3, a plurality of joining holes 59 are formed along the outer edge of the rear surface 58 of the fixing part 50 at intervals of a predetermined angle around the central axis of the fixing part 50.

The outer circumferential surface 50a of the fixing part 50 is formed so that the outer diameter of the outer circumferential surface 50a becomes substantially equal to the inner diameter of the outer circumferential surface 31 when a force is applied to the holding member 30 in its radial direction to reduce the diameter and join the holding member 30 and rotational part 60 together. The thickness of the fixing part 50 is equal to the depth of the inside of the outer circumferential surface 31 of the holding member 30 in the Z direction.

The rotational part 60, which is in a circular ring shape, is placed so that the central axis of the rotational part 60 matches the central axis AX1 of the input assistance device. The rotational part 60 is formed from a metal or another conductive body. The rotational part 60 has a circular ring part 61. Suppressing parts 62, 63, and 64 are formed on the bottom surface 61b of the circular ring part 61 at intervals of a predetermined angle around the central axis of the rotational part 60. The suppressing parts 62, 63, and 64 each have a shape formed by bending the top of a convex part toward the inside in the radial direction, the convex part protruding backward in the Z direction from the bottom surface 61b of the circular ring part 61. The bend portions of the suppressing parts 62, 63, and 64 extend in a plane orthogonal to the Z direction, and respectively form contact parts 62a, 63a, and 64a as conductive areas provided in part of the bottom surface 61b of the circular ring part 61 of the rotational part 60. The suppressing parts 62, 63, and 64 are placed in the circumferential direction of the rotational part 60 so that they are positioned at positions at which the engaging convex parts 32, 33, and 34 of the holding member 30 are not provided when the holding member 30 and rotational part 60 are joined together. On the circular ring part 61, where the suppressing parts 62, 63, and 64 are not provided are allocated so as to correspond to the engaging convex parts 32, 33, and 34 of the holding member 30. The circular ring part 61 is formed so that its inner diameter is equal to the outer diameter of the outer circumferential surface 31 of the holding member 30 and that the outer diameter of the circular ring part 61 is equal to the outer diameters of the engaging convex parts 32, 33, and 34 of the holding member 30. The contact parts 62a, 63a, and 64a each have a shape the inner diameter of which is smaller than the outer diameter of the outer circumferential surface 50a of the fixing part 50.

The suction cup part 70 has a plurality of suction cups 71. The plurality of suction cups 71 are formed from an insulative material. An attachment axis 72 formed on each suction cup 71 is inserted into its corresponding joining hole 59 in the fixing part 50 and is fixed with an adhesive or the like. When a force acting from the forward side in the Z direction to the backward side is applied to the fixing part 50, the plurality of suction cups 71 are sucked by the panel surface 81 of the sensor panel 80. The suction cups 71 are placed on the fixing part 50 so that they are positioned at more inner positions in the radial direction than the contact parts 62a, 63a, and 64a.

The pressing manipulation body 20, holding member 30, intermediate member 40, fixing part 50, rotational part 60, and suction cup part 70 are preferably formed from transparent materials. More specifically, the holding member 30, intermediate member 40, fixing part 50, and suction cup part 70 are formed from transparent insulative resins. For the pressing manipulation body 20 and rotational part 60, a conductive transparent film (ITO (indium tin oxide) film, for example) is formed on a surface of an insulative transparent resin, for example. Thus, the pressing manipulation body 20 preferably becomes electrically continuous from the front surface 21a of the manipulation part 21 through the rear surface 21b and axial part 23 to the contact body 24. Since the pressing manipulation body 20, holding member 30, intermediate member 40, fixing part 50, rotational part 60, and suction cup part 70 are formed from transparent materials as described above and an image displayed on the sensor panel 80 thereby passes through these members, it is possible to make an image displayed on the panel surface 81 visible to the manipulator who manipulates the input system 10 through the members.

The sensor panel 80 forms the input device together with a calculation and control unit 84 indicated in FIG. 5. A plurality of driving electrodes (not illustrated) and a plurality of detection electrodes 83 (FIG. 5) are formed in the sensor panel 80. Since a change in capacitance (mutual capacitance) occurs between a driving electrode and a detection electrode 83 or a change in capacitance (self-capacitance) occurs between a detection electrode 83 and a grounded part, the position of an object is detected, the object having been brought close to the panel surface 81 positioned on the front surface of the sensor panel 80 or having been brought into contact with the panel surface 81.

The calculation and control unit 84 preferably has a capacitance measurement unit 85, a contact position calculation unit 86, a central position calculation unit 87, an image processing unit 88, and an image display unit 89. The capacitance measurement unit 85 calculates the amount of change in capacitance for each detection electrode 83, according to outputs from the plurality of detection electrodes 83. The contact position calculation unit 86 calculates the position of an object brought close to the panel surface 81 or brought into contact with it, according to the placement of the detection electrodes 83 and the result of calculation by the capacitance measurement unit 85.

When the suppressing parts 62, 63, and 64 of the rotational part 60 touch the panel surface 81 on the sensor panel 80, the contact position calculation unit 86 calculates the positions, on the panel surface 81, of the suppressing parts 62, 63, and 64, according to the capacitance calculated by the capacitance measurement unit 85. Since the suppressing parts 62, 63, and 64 are placed on the circular ring part 61 having a circular shape in a plan view, the central position calculation unit 87 may calculate the position, on the panel surface 81, of the central axis of the rotational part 60, that is, the position of the central axis AX1 of the input assistance device, according to the result of calculation by the contact position calculation unit 86. The image processing unit 88 preferably performs processing to change an image to be displayed on the sensor panel 80 to an image matching the position and range, on the panel surface 81, of the input assistance device, according to the result of calculation by the central position calculation unit 87. The image display unit 89 causes the sensor panel 80 to display a certain image, according to the result of image processing by the image processing unit 88.

The input assistance device structured as described above is attached to the sensor panel 80 as described below.

First, the fitting convex parts 44, 45, 46, and 47 of the intermediate member 40 are respectively fitted into the fitting holes 54, 55, 56, and 57 in the fixing part 50 so that the intermediate member 40 and fixing part 50 are joined together. In this joining of the intermediate member 40 and fixing part 50, the elastic member S1 is placed in advance on the rear surface 42 of the intermediate member 40.

Next, the axial part 23 and contact body 24 of the pressing manipulation body 20 are press-fitted from the same side as the front surface 41 into the though-hole 43 in the intermediate member 40. In this press-fitting, the contact body 24 is passed through the though-hole 43 in a state in which the outer diameter is reduced by the applied external force. The axial part 23 and contact body 24, which have been press-fitted into the intermediate member 40, are further passed through the through-hole 53 in the fixing part 50 joined to the intermediate member 40. When, on the rear surface 58 of the fixing part 50, the contact body 24 protrudes from the through-hole 53 to the outside, the outer diameter is restored to the size before the press-fitting due to the elastic force of the contact body 24. Thus, in a state in which it is prevented that the contact body 24 comes off in the vicinity of the rear surface 58 of the fixing part 50, the pressing manipulation body 20, intermediate member 40, and fixing part 50 are joined together (see FIG. 4).

Next, the holding member 30 and rotational part 60 are joined together so as to interpose the fixing part 50 therebetween, to which the pressing manipulation body 20 and intermediate member 40 have been joined. The holding member 30 is brought close to the fixing part 50 from the same side as the pressing manipulation body 20 so that the rear surface 36 of the holding member 30 faces the backward side in the Z direction. The fixing part 50 is brought close to the rotational part 60 from the same side as the rear surface 58 of the fixing part 50, with the contact parts 62a, 63a, and 64a of the rotational part 60 facing the backward side in the Z direction.

In the joining of the holding member 30 and rotational part 60, a force in the radial direction is applied to the engaging convex parts 32, 33, and 34 with the fixing part 50 interposed between the holding member 30 and the rotational part 60 to reduce the diameter of the holding member 30, after which the holding member 30 in this state is inserted into the circular ring part 61 of the rotational part 60. At that time, the positions of the holding member 30 and rotational part 60 are adjusted so that, in the circumferential direction, the engaging convex part 32 of the holding member 30 is positioned in an area 65 between the suppressing parts 62 and 63 of the circular ring part 61, the engaging convex part 33 is positioned in an area 66 between the suppressing parts 63 and 64, and the engaging convex part 34 is positioned in an area 67 between the suppressing parts 64 and 62. After the holding member 30 has been inserted into the circular ring part 61, when a state is reached in which the rear surface 36 of the holding member 30 and the rear surface 58 of the fixing part 50 come into contact with the contact parts 62a, 63a, and 64a of the rotational part 60, the holding member 30 is accommodated in the rotational part 60. At that time, the engaging convex part 32 of the holding member 30 engages the area 65 between the suppressing parts 62 and 63 of the circular ring part 61, the engaging convex part 33 engages the area 66 between the suppressing parts 63 and 64, and the engaging convex part 34 engages the area 67 between the suppressing parts 64 and 62. As illustrated in FIG. 4, the contact parts 62a, 63a, and 64a more protrude toward the sensor panel 80 in the Z direction by a distance L1 than the engaging convex parts 32, 33, and 34. This distance L1 corresponds to the thickness of the contact parts 62a, 63a, and 64a. The contact body 24 is urged by the elastic force of the elastic member S1 in a direction in which the pressing manipulation body 20 is separated from the fixing part 50 in the Z direction, and is positioned more inside the rotational part 60 than the contact parts 62a, 63a, and 64a, by the distance L1.

Next, the suction cup part 70 is joined to the joining holes 59 in the fixing part 50 supported by the rotational part 60 by abutting the suppressing parts 62, 63, and 64. Specifically, the attachment axis 72 of each of the plurality of suction cups 71 is inserted into the corresponding joining hole 59 and is fixed with an adhesive or the like.

With the input assistance device assembled as described above, when the holding member 30 or rotational part 60 is pressed against the panel surface 81 of the sensor panel 80 in the Z direction, the plurality of suction cups 71 fixed to the fixing part 50 preferably adhere to the panel surface 81 and is attached to the sensor panel 80 so that the central axis AX1 is along a direction perpendicular to the panel surface 81. In this state, that is, a state in which an external force is not applied in the Z direction, the plurality of suction cups 71 and the contact parts 62a, 63a, and 64a are in contact with the panel surface 81, but the holding member 30 and contact body 24 are preferably separated from the panel surface 81 by the distance L1. As for the input assistance device, when the holding member 30 or rotational part 60 is pulled in a direction away from the sensor panel 80 to eliminate the adherence of the suction cup part 70 to the panel surface 81, the input assistance device can be removed from the sensor panel 80.

When the input assistance device is attached to the panel surface 81 of the sensor panel 80 as described above, the contact parts 62a, 63a, and 64a are placed in a state in which they are in contact with the panel surface 81 as illustrated in FIG. 4. When, in this state, the manipulator holds the side surface of the rotational part 60 with a hand, since there is electrical continuity from the side surface of the rotational part 60 to the contact parts 62a, 63a, and 64a, a change in capacitance occurs in the detection electrodes 83 corresponding to the contact positions, on the panel surface 81, of the contact parts 62a, 63a, and 64a. The capacitance measurement unit 85 calculates the amount of change in capacitance according to outputs from the detection electrodes 83 at that time. The contact position calculation unit 86 preferably calculates the positions, on the panel surface 81, of the contact parts 62a, 63a, and 64a according to this calculation result. Furthermore, according to the calculation result by the contact position calculation unit 86, the central position calculation unit 87 calculates the central position of a virtual circle drawn on the panel surface 81 by the contact parts 62a, 63a, and 64a, that is, the position of the central axis AX1 of the input assistance device. The image processing unit 88 performs processing to change an image to be displayed on the sensor panel 80 to an image matching the position and range of the input assistance device, according to the result of calculation by the central position calculation unit 87. According to this processing result, the image display unit 89 causes the sensor panel 80 to display a certain image.

The calculation and control unit 84 may determine whether the central position calculated by the central position calculation unit 87 is appropriate as a position at which to attach the input assistance device. If the calculation and control unit 84 determines that the central position is not appropriate, the calculation and control unit 84 may indicate the determination on the panel surface 81.

The rotational part 60 is rotatable around the central axis AX1 together with the holding member 30 joined to the rotational part 60. In other words, the rotational part 60 is supported by the fixing part 50 used as a rotation support body so as to be rotatable around the central axis of the fixing part 50. When the rotational part 60 is rotated, the positions, on the panel surface 81, of the contact parts 62a, 63a, and 64a change. When the plurality of detection electrodes 83 continuously detect these positional changes and the contact position calculation unit 86 continuously calculate the positions of the contact parts 62a, 63a, and 64a according to the detection results, information about the rotation of the rotational part 60 such as, for example, the direction, angle, and speed can be calculated. The calculation and control unit 84 uses the calculated information about the rotation as an input resulting from the rotational operation of the rotational part 60 and causes the sensor panel 80 to execute an operation and image display in correspondence to this input.

When the manipulator presses the pressing manipulation body 20 toward the panel surface 81 in the Z direction, the contact body 24 preferably comes into contact with the panel surface 81 or comes close to it. At that time, since the pressing manipulation body 20 has conductivity, a change in capacitance occurs in the detection electrode 83 corresponding to the contact position or close position, on the panel surface 81, of the contact body 24. This change in capacitance is calculated by the capacitance measurement unit 85 according to the output from the detection electrode 83. The contact position calculation unit 86 calculates the contact position of the contact body 24 according to this calculation result. From this calculation result, the calculation and control unit 84 determines that the pressing manipulation body 20 has been manipulated with the input assistance device attached to the panel surface 81 and that an input manipulation based on the pressing manipulation body 20 has been performed, and causes the sensor panel 80 to perform operation and image display in correspondence to this input manipulation. By pressing the pressing manipulation body 20 toward the panel surface 81, the suction cup part 70 is also pressed toward the panel surface 81 through the intermediate member 40, elastic member S1, and fixing part 50. Therefore, a force with which each suction cup 71 adheres to the panel surface 81 can be increased.

According to the first embodiment, the following effects are obtained from the above structure.

(1) Since the input assistance device can be attached and detached by using the suction cup part 70, an input by a rotational manipulation can be made at a desired position on the panel surface 81.

(2) The rotational part 60 is rotatable around the central axis of the fixing part 50 attached to the sensor panel 80, so it becomes possible to accurately make an input through a fixed path.

(3) Since the contact parts 62a, 63a, and 64a are provided on part of the bottom surface of the rotational part 60 in a circular ring shape as current-carrying areas, the contact position calculation unit 86 can calculate the positions of the contact parts 62a, 63a, and 64a and the central position calculation unit 87 can calculate the position of the central axis of the rotational part 60 from this calculation result. This can contribute to determination as to whether the position at which to attach the input assistance device is appropriate.

A variation will be described below.

(1) Although, in the first embodiment, three contact parts 62a, 63a, and 64a have been provided on the bottom surface 61b of the circular ring part 61 of the rotational part 60 as the conductive areas, the number of conductive areas may be 1, 2, or 4 or more unless the whole of the bottom surface 61b is a conductive area. The size and shape of each area can be arbitrary set.

The rotational part 60 only needs to be formed from a conductive material so that an electrical connection is made from the side surface of the circular ring part 61 held by the manipulator to the contact parts 62a, 63a, and 64a. For example, the rotational part 60 is formed from an insulative material, and a thin film is formed with a conductive material in a range from the side surface of the circular ring part 61 to the contact parts 62a, 63a, and 64a by sputtering, coating, or the like. In this case, areas on the bottom surface 61b of the circular ring part 61 of the rotational part 60 other than the contact parts 62a, 63a, and 64a become non-conductive, so the positions of the contact parts 62a, 63a, and 64a can be easily detected. This is preferable.

Figure 6A:
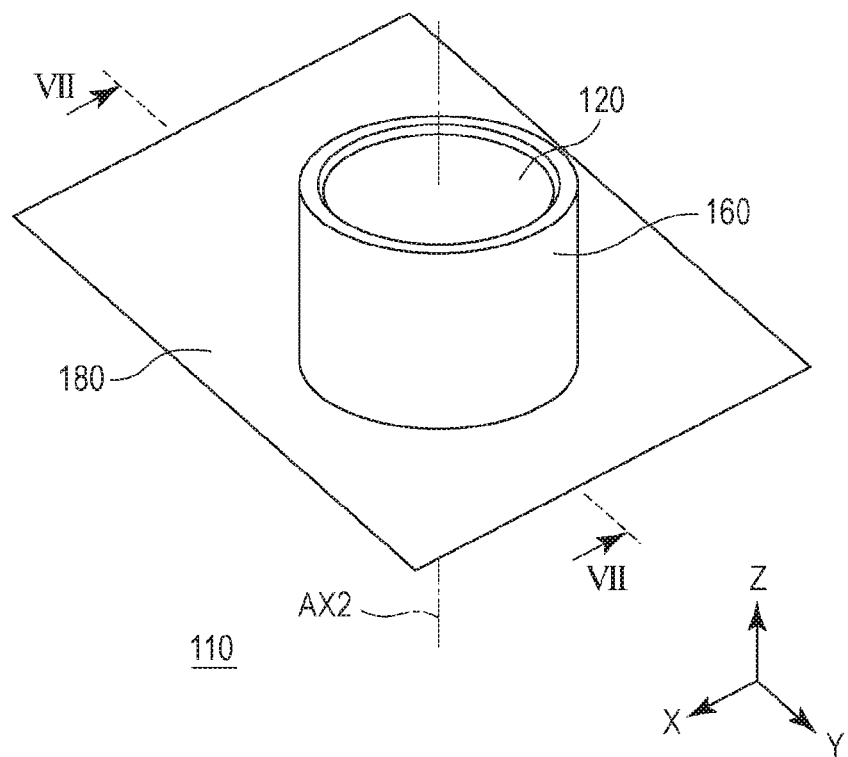
FIG. 6A is a perspective view illustrating the structure of an input system according to a variation in the first embodiment.
Figure 6B:
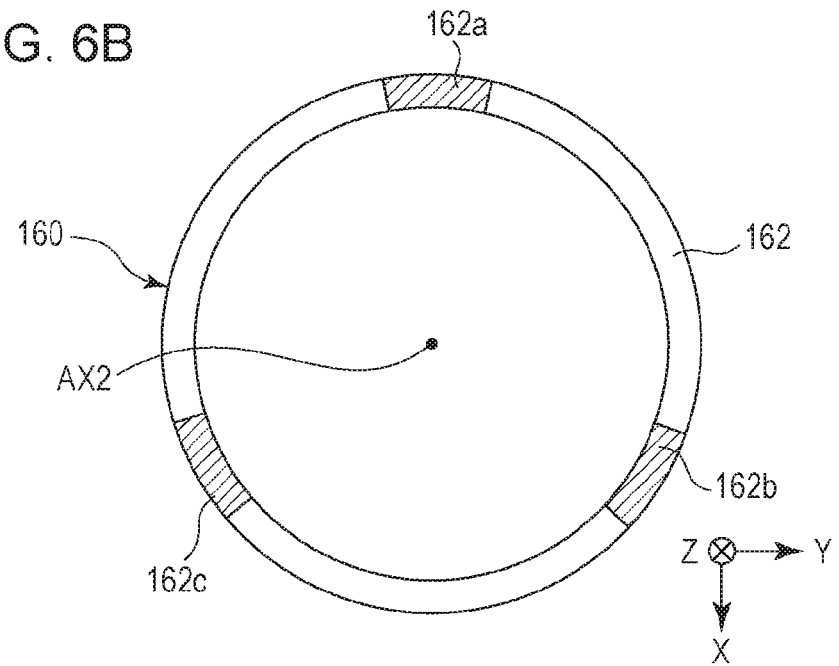
FIG. 6B is a bottom view illustrating the structure of the bottom surface of a rotational part.
Figure 7:
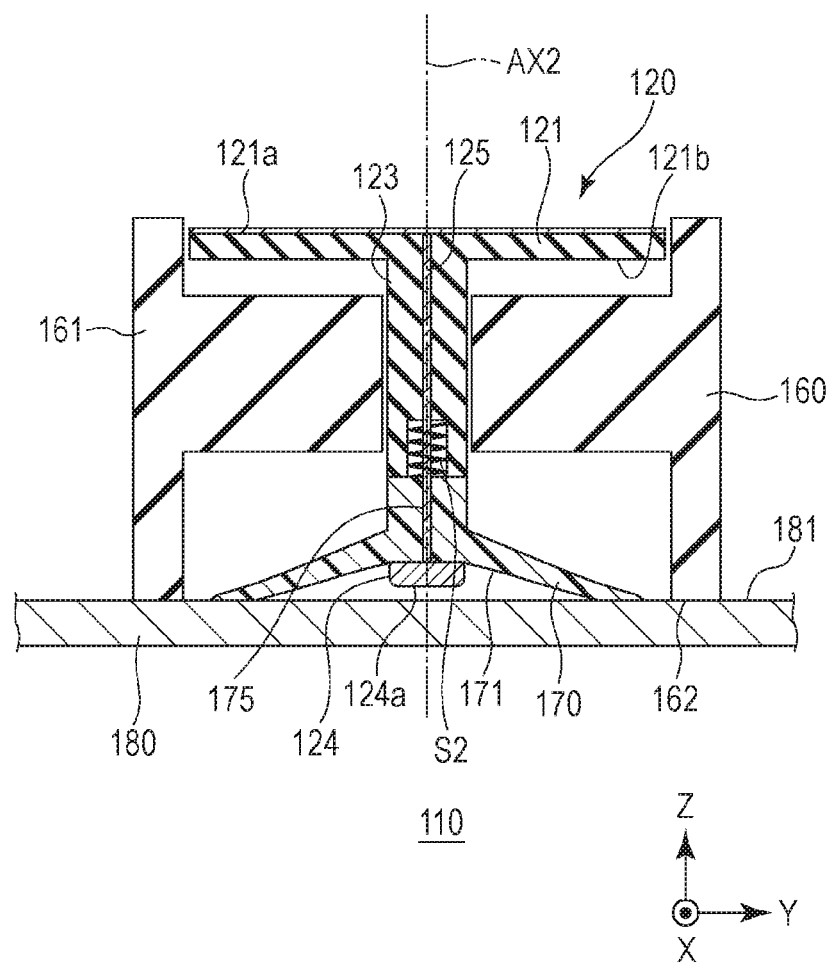
FIG. 7 is a cross-sectional view taken along line VII-VII in FIG. 6A.

(2) FIG. 6A is a perspective view illustrating the structure of an input system 110 according to the variation, and FIG. 6B is a bottom view illustrating the structure of the bottom surface 162 of a rotational part 160. FIG. 7 is a cross-sectional view taken along line VII-VII in FIG. 6A.

As illustrated in FIGS. 6A, 6B, and 7, a suction cup part 170 used as an attachment mechanism may be provided at the top of the axial part 123 of a pressing manipulation body 120. The input system 110 in this variation has the pressing manipulation body 120, an elastic member S2, a rotational part 160, the suction cup part 170, and an input device having a sensor panel 180. The sensor panel 180 has a structure similar to the structure of the sensor panel 80 in the first embodiment, so detailed descriptions of the sensor panel 180 will be omitted. The sensor panel 180 constitutes the input device together with the calculation and control unit 84 indicated in FIG. 5.

As in the pressing manipulation body 20 in the first embodiment, the pressing manipulation body 120 has a manipulation part 121, which is circular in a plan view, and is placed so that the central axis matches the central axis AX2 of the input assistance device. The pressing manipulation body 120 is formed from an insulative material (a resin, for example). The axial part 123 of the pressing manipulation body 120 extends toward the sensor panel 180 in the Z direction from the center of the rear surface 121b of the manipulation part 121 in a circular plate shape. At the top of the axial part 123, the suction cup part 170 is joined through the elastic member S2. The elastic member S2 is, for example, a compression spring or rubber member, and urges the pressing manipulation body 120 in a direction away from the panel surface 181 along the Z direction. A film made is formed from a conductive material on the front surface 121a of the manipulation part 121. In the pressing manipulation body 120, a conductive path 125 is formed along the central axis by filling a though-hole passing through the pressing manipulation body 120 in the Z direction with a conductive material and then solidifying it. The conductive path 125 and the conductive film on the front surface 121a are electrically connected mutually.

The rotational part 160, which has a cylindrical outside shape as illustrated in FIG. 6A, is formed from an insulative material. The rotational part 160 is rotatably supported by the pressing manipulation body 120, which is preferably used as a rotation support body, so that the central axis of the rotational part 160 matches the central axis AX2 of the input assistance device. A film is formed from a conductive material on the side surface 161 of the rotational part 160. As illustrated in FIG. 6B, conductive areas 162a, 162b, and 162c are provided on the bottom surface 162, facing panel surface 181, of the rotational part 160. The conductive areas 162a, 162b, and 162c are placed on the bottom surface 162 in a circular shape at equal angular intervals around the central axis of the rotational part 160. The conductive areas 162a, 162b, and 162c and the conductive film formed on the side surface 161 are electrically connected mutually.

The suction cup part 170, which is formed from an insulative material, is placed so that the central axis of the suction cup part 170 matches the central axis AX2 of input assistance device. On the same side as the sensor panel 180, the suction cup part 170 has a space 171 depressed upward in the Z direction. On the inner surface of the space 171, a contact body 124 formed form a conductive material is provided on the central axis of the suction cup part 170. This contact body 124 has conductivity and elasticity, as with the contact body 24 in the first embodiment. In the suction cup part 170, when at least a predetermined force is applied to the manipulation part 121 of the pressing manipulation body 120 in a direction toward the sensor panel 180 in the Z direction, the space 171 is contracted in the Z direction and the suction cup part 170 adheres to the panel surface 181. At that time, the bottom surface 124a of the contact body 124 comes into contact with the panel surface 181. Even if the force that has been applied to the suction cup part 170 is eliminated in the state in which the suction cup part 170 adheres to the panel surface 181, the suction cup part 170 remains adhering to the panel surface 181, but the space 171 expands and the bottom surface 124a of the contact body 124 is separated from the panel surface 181. When the pressing manipulation body 120 is pulled up with at least a predetermined force from this state in a direction away from the panel surface 181 along the Z direction, the input assistance device can be removed from the sensor panel 180.

In the suction cup part 170, a conductive path 175 is formed along the central axis by filling a though-hole passing through the suction cup part 170 in the Z direction with a conductive material and then solidifying it. The conductive film on the front surface 121a, the conductive path 125, the conductive path 175, and the contact body 124 are electrically connected sequentially.

When the input assistance device is attached to the panel surface 181 of the sensor panel 180 by the suction cup part 170, the conductive areas 162a, 162b, and 162c on the bottom surface 162 of the rotational part 160 are placed in a state in which they are in contact with the panel surface 181. When, in this state, the manipulator holds the side surface 161 of the rotational part 160 with a hand, since there is electrical continuity between the side surface 161 and the conductive areas 162a, 162b and 162c, a change in capacitance occurs in the detection electrodes 83 corresponding to the contact positions, on the panel surface 181, of the conductive areas 162a, 162b, and 162c. Therefore, the amount of change in capacitance is calculated by a procedure similar to the processing procedure in the first embodiment. Furthermore, the positions of the conductive areas 162a, 162b and 162c are calculated. Furthermore, the position, on the panel surface 81, of the central axis AX2 of the input assistance device is calculated. Image processing and image display based on the calculated position of the central axis AX2 are also similar to the first embodiment.

When the manipulator presses the pressing manipulation body 120 toward the panel surface 181 in the Z direction, the contact body 124 comes into contact with the panel surface 181 or comes close to it. At that time, the front surface 121a, the conductive path 125, the conductive path 175, and the bottom surface 124a of the contact body 124 are electrically connected mutually, so a change in capacitance occurs in the detection electrode 83 corresponding to the contact position or close position, on the panel surface 181, of the contact body 124, that is, the position of the central axis AX2 of the input assistance device. Calculation of the contact position of the contact body 124 and execution of image display and the like according to this change in capacitance are similar to the first embodiment.

According to this variation, since the pressing manipulation body 120 functions as a rotational support body, the input assistance device can have a simpler structure than in the first embodiment, making it possible to reduce the number of parts.

Second Embodiment

A second embodiment of the present invention differs from the first embodiment in that a base member 250 and a set of rail members 281 and 282 are preferably used as an attachment mechanism.

Figure 8:
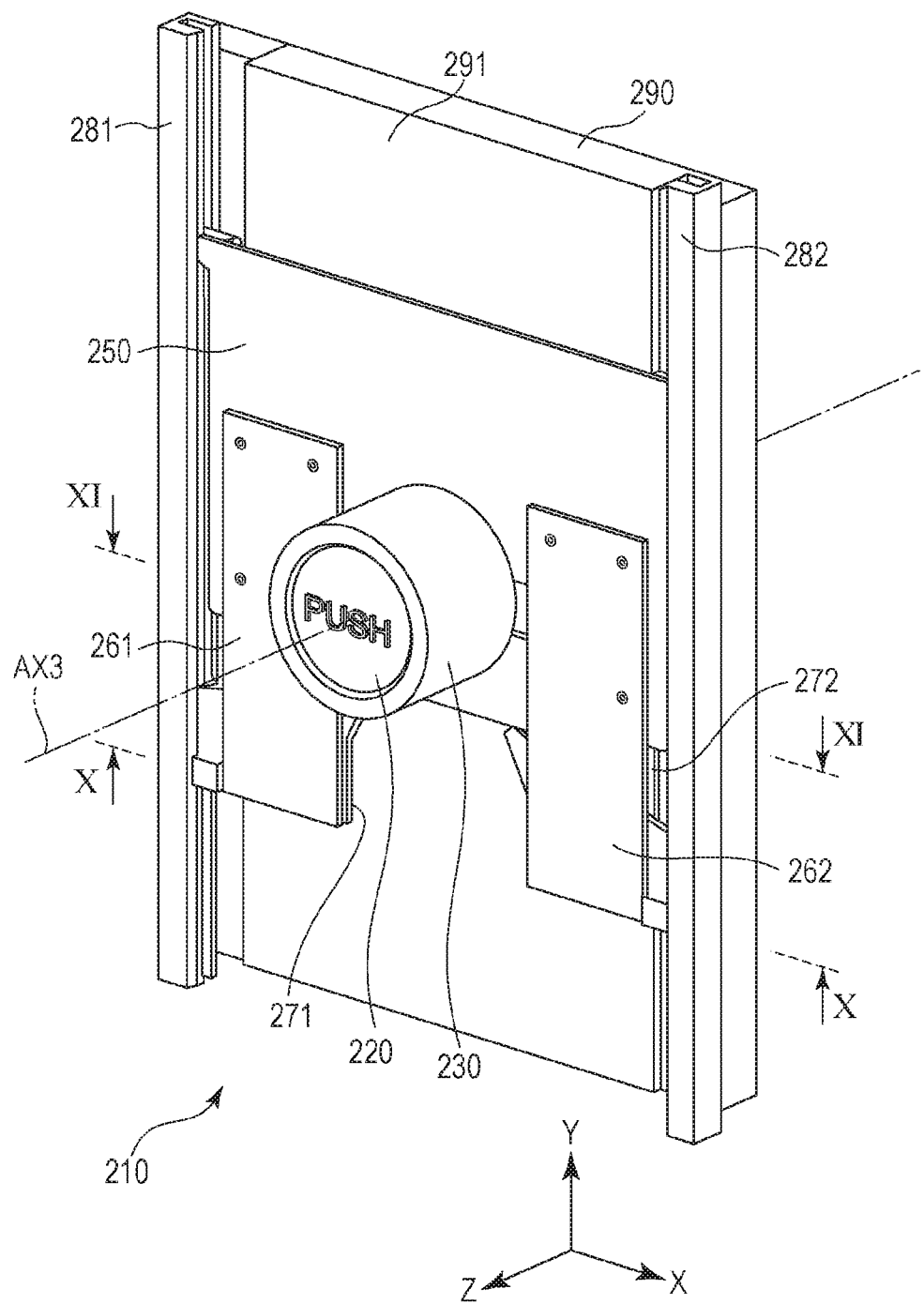
FIG. 8 is a perspective view illustrating the structure of an input system according to a second embodiment of the present invention.
Figure 9:
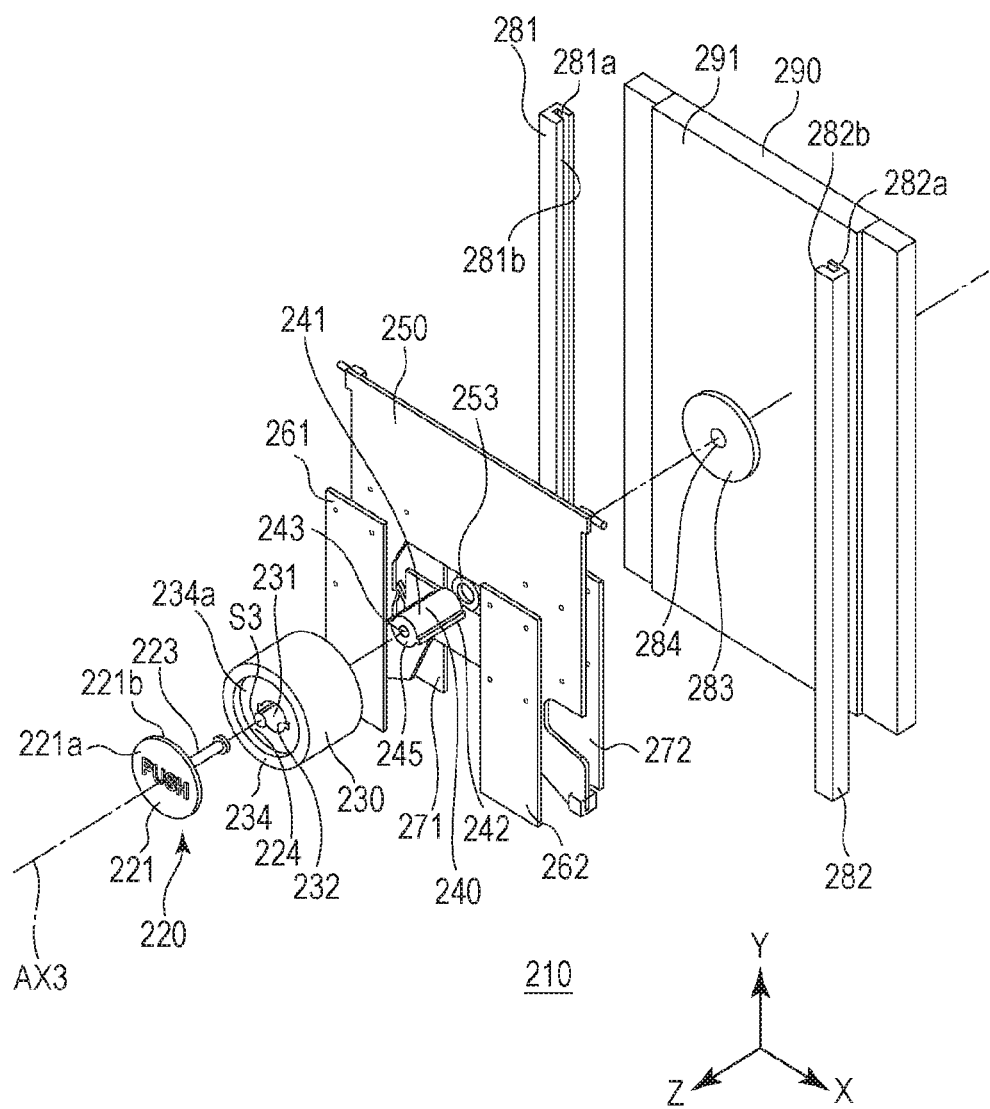
FIG. 9 is an exploded perspective view illustrating the structure of the input system according to the second embodiment.
Figure 10:
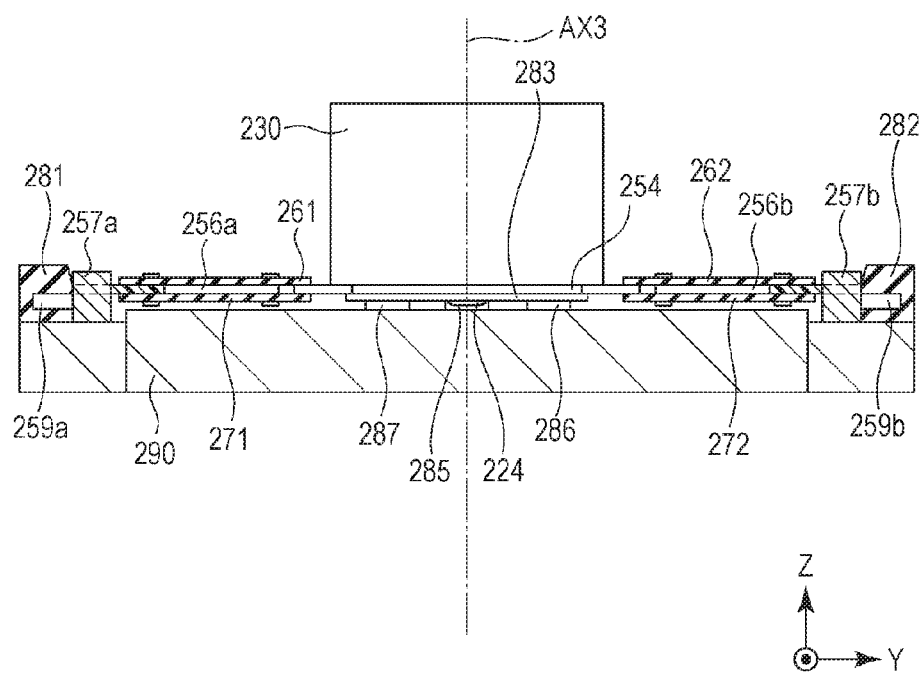
FIG. 10 is a cross-sectional view taken along line X-X in FIG. 8.
Figure 11:
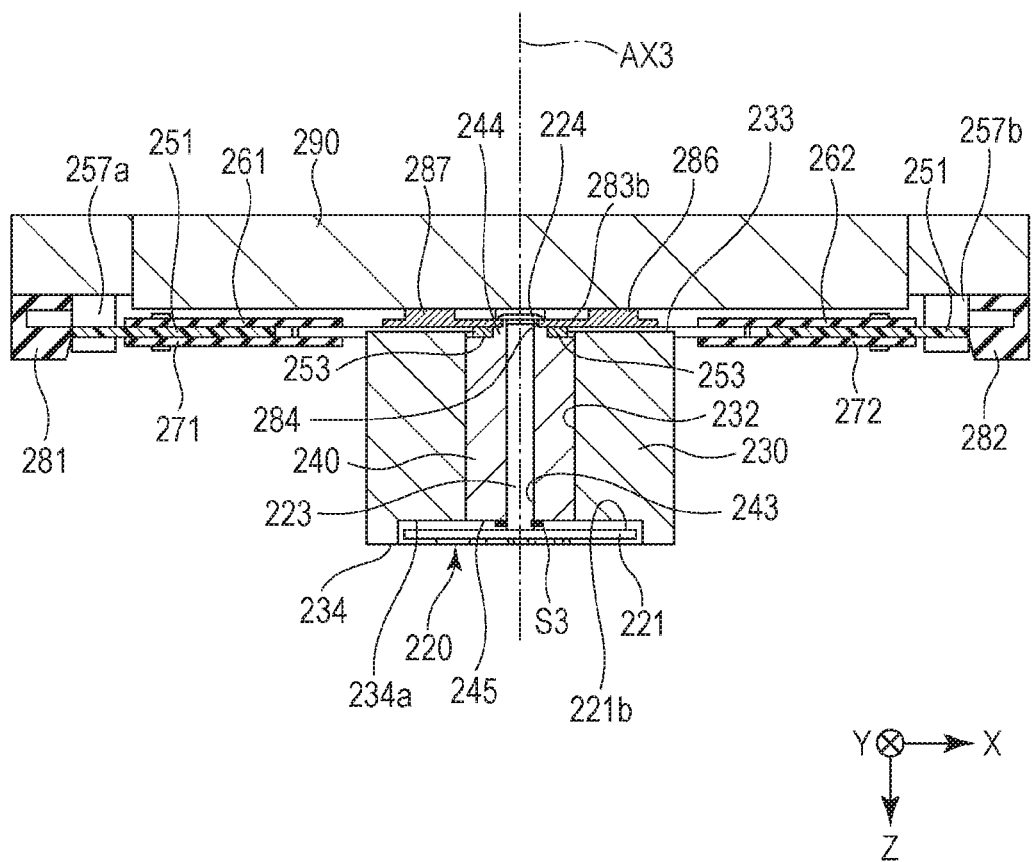
FIG. 11 is a cross-sectional view taken along line XI-XI in FIG. 8.
Figure 12:
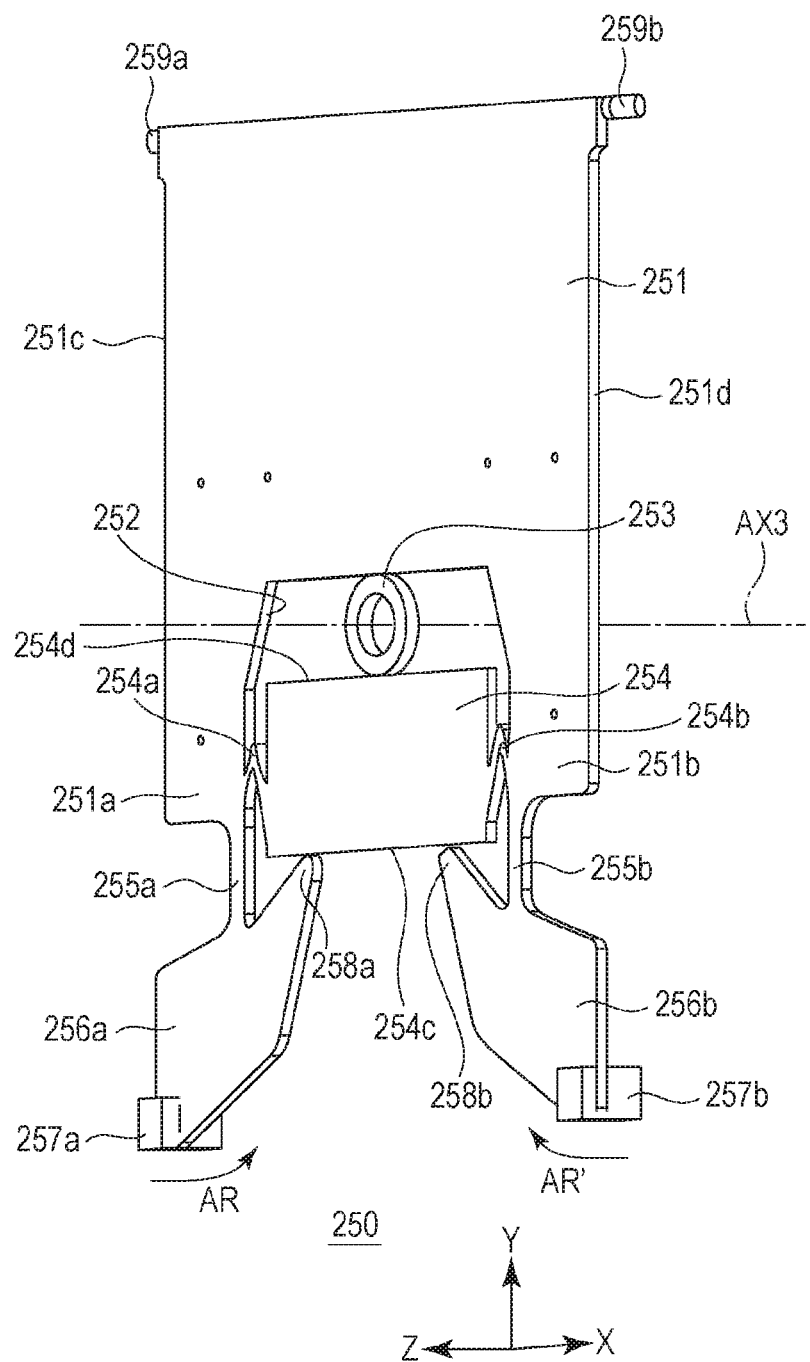
FIG. 12 is a perspective view illustrating the structure of a base member in the second embodiment.
Figure 13:
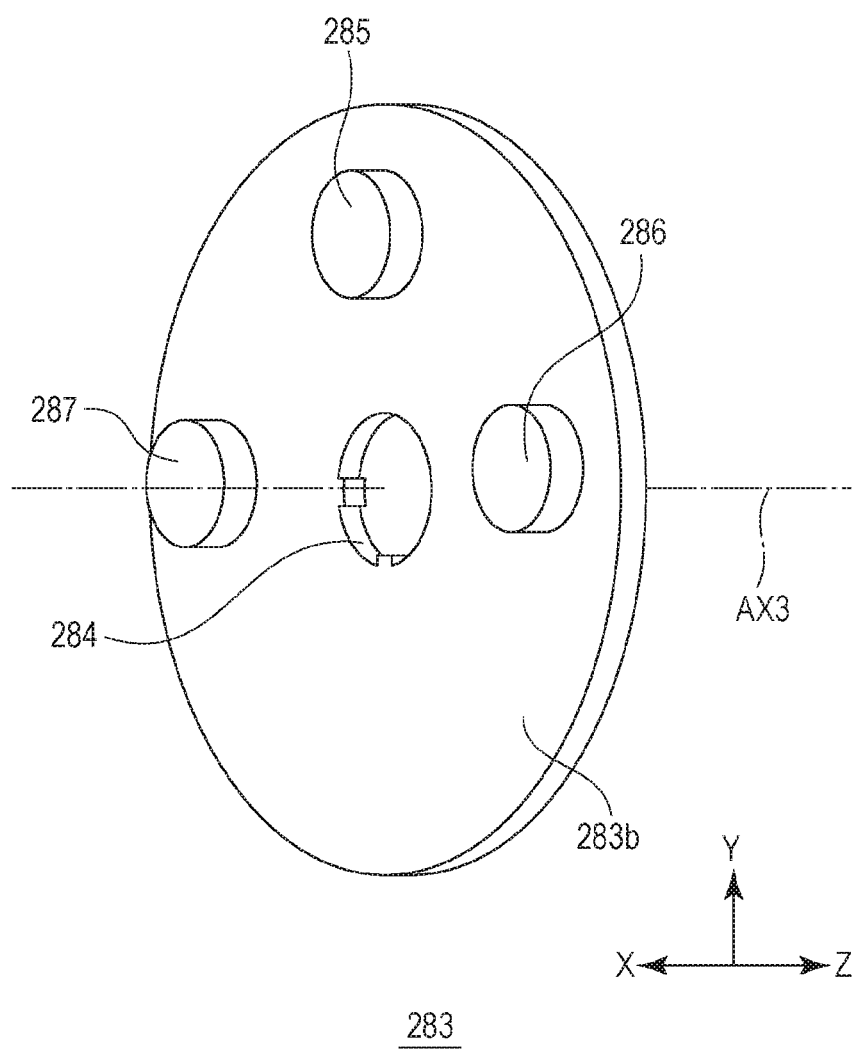
FIG. 13 is a perspective view when a rotational top in the second embodiment is viewed from the rear surface side.

FIG. 8 is a perspective view illustrating the structure of an input system 210 according to the second embodiment. FIG. 9 is an exploded perspective view illustrating the structure of the input system 210, as viewed from the same side as the front surface 221a of the manipulation part 221 of a pressing manipulation body 220. FIG. 10 is a cross-sectional view taken along line X-X in FIG. 8. FIG. 11 is a cross-sectional view taken along line XI-XI in FIG. 8. FIG. 12 is a perspective view illustrating the structure of the base member 250. FIG. 13 is a perspective view when a rotational top part 283 is viewed from the same side as a rear surface 283b. In each drawing, an X-Y-Z coordinate system is indicated as a basic coordinate system. The Z direction is along a direction in which the central axis AX3 of an input assistance device extends, and the X-Y plane is orthogonal to the Z direction. The input assistance device has the pressing manipulation body 220, an elastic member S3, a rotational manipulation part 230, a joining axial part 240, the base member 250, four auxiliary plates 261, 262, 271 and 272, the set of rail members 281 and 282, and the rotational top part 283, which are all included in the input system 210. The rotational manipulation part 230, joining axial part 240, and rotational top part 283 constitute a rotational part, and the base member 250, auxiliary plates 261, 262, 271 and 272, and rail members 281 and 282 preferably constitute the attachment mechanism.

As illustrated in FIG. 8 or 9, the input system 210 has the pressing manipulation body 220, the elastic member S3, the rotational manipulation part 230, the joining axial part 240, the base member 250 including a bearing circular ring part 253, the four auxiliary plates 261, 262, 271 and 272, the set of rail members 281 and 282, the rotational top part 283, and an input device having a sensor panel 290. As illustrated in FIGS. 8 and 9, the pressing manipulation body 220, elastic member S3, rotational manipulation part 230, joining axial part 240, base member 250, bearing circular ring part 253, and rotational top part 283 are sequentially placed along the central axis AX3 of the input assistance device so that their central axes match the central axis AX3 of the input assistance device.

The pressing manipulation body 220 has a structure similar to the structure of the pressing manipulation body 20 in the first embodiment; the pressing manipulation body 220 has the manipulation part 221, which is circular in a plan view, and is placed so that its central axis matches the central axis AX3 of the input assistance device. The pressing manipulation body 220 has an axial part 223 extending backward in the Z direction from the center of the rear surface 221b of the manipulation part 221 in a circular plate shape. At the top of the axial part 223, a contact body 224 having elasticity is provided. The pressing manipulation body 220 is formed from a metal or another conductive body. The contact body 224 has both conductivity and elasticity because it uses a resin having conductivity or the like. When an external force is not applied to the contact body 224, the contact body 224 maintains a predetermined outer diameter larger than the outer diameter of the axial part 223. When an external force that compresses the contact body 224 is applied to it, the contact body 224 can be contracted due to its elasticity at least until its outer diameter becomes equal to the outer diameter of the axial part 223.

The rotational manipulation part 230, which is in a cylindrical shape, is placed so that the central axis of the rotational manipulation part 230 matches the central axis AX3 of the input assistance device. In the inner circumferential surface 231 of the rotational manipulation part 230, two engaging grooves 232 are formed along the central axis of the rotational manipulation part 230 so as to expand outward in the radial direction. At the center of the front surface 234 on the forward side of the rotational manipulation part 230 in the Z direction, a concave part 234a depressed toward the backward side in the Z direction is provided. This concave part 234a has an inner diameter equal to the outer diameter of the manipulation part 221 of the pressing manipulation body 220. The rotational manipulation part 230 is preferably formed from a metal or another material having conductivity.

The joining axial part 240, which is in a cylindrical shape, is preferably placed so that the central axis of the joining axial part 240 matches the central axis AX3 of the input assistance device. The diameter of the outer circumferential surface 241 of the joining axial part 240 is equal to the inner circumferential diameter of the inner circumferential surface 231 of the rotational manipulation part 230. On the outer circumferential surface 241, two engaging protrusions 242 are formed so as to correspond to the two engaging grooves 232 in the inner circumferential surface 231 of the rotational manipulation part 230. These engaging protrusions 242 protrude toward the outer side in the radial direction and are along the central axis of the joining axial part 240. The inner circumferential surface 243 of the joining axial part 240 has an inner diameter large enough for the axial part 223 of the pressing manipulation body 220 to be inserted in the axial direction. The joining axial part 240 is formed from a metal or another material having conductivity.

The base member 250 is formed in a plate shape by molding an elastically deformable material having insulative nature such as, for example, a resin. The base member 250 has an opening 252 at the center of an XY plane, as illustrated in FIG. 12. The bearing circular ring part 253 is preferably placed at the central position of the opening 252 in a state in which the bearing circular ring part 253 can be fixed and removed. The shape of the opening 252 is determined by a base 251, which is in a substantially U-shape having an opening on the lower side in the Y direction, and a fixing plate part 254 placed in the opening of the U-shape of the base 251. The fixing plate part 254 used as a fixing part is connected to two lower ends 251a and 251b of the base 251 in a substantially U-shape through two connecting parts 254a and 254b, respectively, that extend outward from both end surfaces in the X direction.

The bearing circular ring part 253 has an inner diameter large enough to support the joining axial part 240 and is placed so that the side surface can be brought into contact with the inner surface of the opening 252 and can be separated from the inner surface. With the bearing circular ring part 253 placed at the above central position, the central axis of the bearing circular ring part 253 coincides with the central axes of the joining axial part 240 and rotational top part 283, and the bearing circular ring part 253, which is preferably used as the rotational support body, preferably supports the rotational part so that the joining axial part 240 and rotational top part 283 are rotatable around the central axis of the rotational support body.

Two arm parts 255a and 255b respectively extend downward from the lower ends 251a and 251b of the base 251. Two wedge parts 256a and 256b are respectively provided at the lower ends of these arm parts 255a and 255b. The wedge parts 256a and 256b respectively have abutting parts 257a and 257b formed at the lower ends of the ends in the X direction so as to expand forward and backward in the Z direction. The upper end 258a of the wedge part 256a and the upper end 258b of the wedge part 256b each have a tapered shape that is thinned as it extends upward.

In a state in which an external force is not applied to the wedge parts 256a and 256b, the upper ends 258a and 258b are separated from the lower surface 254c of the fixing plate part 254, and the abutting parts 257a and 257b disposed at the outermost positions of the base member 250 in the X direction are respectively positioned outside the side surfaces 251c and 251d of the base 251. In this state, the bearing circular ring part 253 has not been fixed to the opening 252 and is thereby displaceable in the opening 252.

By contrast, when forces are applied to the wedge parts 256a and 256b so that they move toward the inner side in the X direction, since the arm parts 255a and 255b are elastically deformable, the wedge parts 256a and 256b are displaced toward the fixing plate part 254 as indicated by the arrows AR and AR' in FIG. 12 and their upper ends 258a and 258b abut the lower surface 254c of the fixing plate part 254. Accordingly, the connecting parts 254a and 254b are elastically deformed and the upper surface 254d of the fixing plate part 254 thereby abuts the lower surface of the bearing circular ring part 253, so the bearing circular ring part 253 is sandwiched between the upper surface 254d of the fixing plate part 254 and an inner surface of the opening 252. Thus, the bearing circular ring part 253 is fixed at the central position described above, restricting the displacement of the bearing circular ring part 253 in the X direction. At that time, the wedge parts 256a and 256b are respectively at the same positions as the side surfaces 251c and 251d of the base 251 in the X direction.

Moreover, two engaging parts 259a and 259b extending outward in an axial shape are provided at both ends, one at each end, at the top of the base 251 in the X direction.

The rail members 281 and 282, which are formed from an insulative material such as, for example, a resin, are fixed in parallel to each other in predetermined areas on the panel surface 291 of the sensor panel 290, that is, areas outside a manipulation area on the sensor panel 290. Although the rail members 281 and 282 are fixed with an adhesive or the like, magnetic materials may be placed on the rail members 281 and 282 and the sensor panel 290 and the rail members 281 and 282 may be removably attached through their magnetism. The rail members 281 and 282 respectively have grooves 281a and 282a extending in their longitudinal directions, and are placed on the panel surface 291 so that the groove parts 281a and 282a face each other.

After the rail members 281 and 282 have been placed as described above, when the engaging part 259a is fitted into the groove 281a in the rail member 281 and the engaging part 259b is fitted into the groove 282a in the rail member 282 paired with the rail member 281, as illustrated in FIG. 10, the base member 250 is preferably attached in a state in which it can move upward and downward. The attached base member 250 can rotate around the engaging parts 259a and 259b, which are used as axes. With the base member 250 in this state, in a state in which forces are applied to the wedge parts 256a and 256b so that they move inward in the X direction and the spacing between the abutting parts 257a and 257b is narrowed, the wedge parts 256a and 256b are led into an area sandwiched between the two rail members 281 and 282 and the external forces are removed, the outer surfaces of the abutting parts 257a and abutting part 257b respectively abut the inner surfaces 281b and 282b of the rail members 281 and 282. Thus, the upward and downward movements and rotation of the base member 250 are restricted, and the base member 250 is fixed to the sensor panel 290.

The auxiliary plates 261, 262, 271 and 272 are formed from an insulative material such as, for example, a resin. The auxiliary plates 261, 262, 271 and 272 have stiffness enough to maintain a state in which the abutting parts 257a and 257b are respectively in contact with the inner surface 281b of the rail members 281 and the inner surface 282b of the rail member 282 when the auxiliary plates 261 and 271 and the auxiliary plates 262 and 272 sandwich the base member 250 from its front and back. The auxiliary plates 261 and 271 are placed on the left side of the base member 250 so as to sandwich the lower end 251a, fixing plate part 254, connecting part 254a, arm part 255a, and wedge part 256a from the front and back. The auxiliary plates 261 and 271 and the base member 250 sandwiched between them are mutually fixed with screws (not illustrated). Similarly, the auxiliary plates 262 and 272 are placed on the right side of the base member 250 so as to sandwich the lower end 251b, fixing plate part 254, connecting part 254b, arm part 255b, and wedge part 256b from the front and back. The auxiliary plates 262 and 272 and the base member 250 sandwiched between them are mutually fixed with screws (not illustrated).

The rotational top part 283 is in a circular plate shape having an opening 284 at the center and is placed so that the central axis of the rotational top part 283 matches the central axis AX3 of the input assistance device. The rotational top part 283 is formed from a metal or another conductive body. On the rear surface 283b, as illustrated in FIG. 13, three contact parts 285, 286, and 287 are preferably provided as current-carrying areas at equal angular intervals around to the central axis of the rotational top part 283, the contact parts 285, 286, and 287 protruding in a columnar shape toward the panel surface 291 of the sensor panel 290 along the Z direction. The shapes of the contact parts 285, 286, and 287 are not limited to a columnar shape. It is also possible to form the contact parts 285, 286, and 287 from a material having conductivity and elasticity.

The pressing manipulation body 220, elastic member S3, rotational manipulation part 230, joining axial part 240, base member 250, auxiliary plates 261, 262, 271 and 272, and the rotational top part 283 are preferably formed from a transparent material as with the pressing manipulation body 20 and the like in the first embodiment.

The sensor panel 290 has a structure similar to the structure of the sensor panel 80 in the first embodiment, and constitutes the input device together with the calculation and control unit 84 indicated in FIG. 5.

When the contact parts 285, 286, and 287 of the rotational top part 283 come into contact with the panel surface 291 of the sensor panel 290, the contact position calculation unit 86 calculates the positions, on the panel surface 291, of the contact parts 285, 286, and 287 according the capacitance calculated by the capacitance measurement unit 85. Since the contact parts 285, 286, and 287 are placed on a virtual circle drawn by the rotational top part 283, the central position calculation unit 87 can calculate the position, on the panel surface 291, of the central axis of the rotational top part 283, that is, the position of the central axis AX3 of the input assistance device, according to the result of calculation by the contact position calculation unit 86. The image processing unit 88 performs processing to change an image to be displayed on the sensor panel 290 to an image matching the position and range, on the panel surface 291, of the input assistance device, according to the result of calculation by the central position calculation unit 87. The image display unit 89 causes the sensor panel 290 to display a certain image, according to the result of image processing by the image processing unit 88.

The input assistance device having the structure described above is attached to the sensor panel 290 as described below.

First, the rail members 281 and 282 are preferably fixed to predetermined positions on the panel surface 291 of the sensor panel 290. The engaging part 259a is inserted into the groove 281a in the rail member 281 and the engaging part 259b is inserted into the groove 282a in the rail member 282, attaching the base member 250 to the sensor panel 290 in a state in which the base member 250 is movable upward and downward.

As for the rotational part, the joining axial part 240 is first inserted into the interior of the rotational manipulation part 230. To insert the joining axial part 240, each of the two engaging protrusions 242 is inserted into one of the two engaging grooves 232 in the inner circumferential surface 231 of the rotational manipulation part 230 in the Z direction, while being fitted into the engaging grooves 232, after which the rotational manipulation part 230 and joining axial part 240 are fixed to each other with an adhesive or the like. In this state, as illustrated in FIG. 11, a front surface 245 on the forward side of the joining axial part 240 in the Z direction forms the same plane as the surface of the concave part 234a of the rotational manipulation part 230. A joint protrusion 244 is provided at the rear end of the joining axial part 240, that is, the end of the sensor panel 290 in the Z direction so as to protrude backward. When the front surface 245 and the surface of the concave part 234a form the same plane, the joint protrusion 244 protrudes backward beyond the rear surface 233 of the rotational manipulation part 230. Furthermore, when this joint protrusion 244 passes through the bearing circular ring part 253 and the opening 284 in the rotational top part 283 in that order, the rotational manipulation part 230, joining axial part 240, and rotational top part 283 are joined together in a state in which the joint protrusion 244 is supported by the bearing circular ring part 253.

Next, as illustrated in FIG. 11, the pressing manipulation body 220 is joined to the rotational manipulation part 230 and joining axial part 240, which have been fixed to each other, with the elastic member S3 intervening therebetween. To join the pressing manipulation body 220 in this way, the axial part 223 and contact body 224 are passed through the elastic member S3 in a circular ring shape and are then press-fitted from the front surface 245 of the joining axial part 240 into the inner circumferential surface 243. In this press-fitting, the diameter of the contact body 224 is reduced by the applied external force, and, in this state, the contact body 224 is passed through the inner circumferential surface 243 of the joining axial part 240 and is further passed through the opening 284 in the rotational top part 283. The contact body 224 extends from the rear surface 283b of the rotational top part 283 toward the sensor panel 290. The outer diameter of the contact body 224 is restored to the size before the press-fitting due to its elastic force. Thus, in a state in which it is prevented that the axial part 223 comes off in the vicinity of the rear surface 283b of the rotational top part 283, the pressing manipulation body 220, rotational manipulation part 230, joining axial part 240, and rotational top part 283 are joined together, forming the rotational part.

In a state in which the pressing manipulation body 220 is not manipulated, an amount by which the contact body 224 extends from the rear surface 283b is smaller than an amount by which the contact parts 285, 286, and 287 protrude from the rear surface 283b.

Next, in a state in which forces are applied to the wedge parts 256a and 256b so that they move toward the inner side in the X direction, the base member 250 is led into a space formed between the two rail members 281 and 282, after which the forces that have been applied are removed in a state in which the outer surfaces of the abutting parts 257a and 257b are respectively in contact with the inner surfaces 281b and 282b of the rail members 281 and 282. In this state, the abutting parts 257a and 257b are strongly pressed against the inner surfaces 281b and 282b due to elastic forces with which the arm parts 255a and 255b respectively expand outward in the X direction. Therefore, the upward and downward movements and rotation of the base member 250 are restricted, and the base member 250 is fixed to the sensor panel 290. To keep the base member 250 deformed as described above, the auxiliary plates 261 and 271 are fixed by being screwed with the base member 250 interposed therebetween and the auxiliary plates 262 and 272 are similarly fixed by being screwed. When the base member 250 is fixed in this way, the bearing circular ring part 253 is held and fixed at the central position described above by the upper surface 254d of the fixing plate part 254 and the inner surface of the opening 252, and the rotational part is rotatably supported by the bearing circular ring part 253 used as a rotation support body.

In the input system 210 assembled as described above, the contact parts 285, 286, and 287 of the rotational top part 283 are in contact with the panel surface 291. When the manipulator holds the rotational manipulation part 230, since the rotational manipulation part 230, joining axial part 240, and rotational top part 283 have electrical continuity, a change in capacitance occurs in the detection electrodes 83 corresponding to the contact positions, on the panel surface 291 of the contact parts 285, 286, and 287. The capacitance measurement unit 85 calculates the amount of change in capacitance according to the outputs from the detection electrodes 83 at that time. The contact position calculation unit 86 calculates the positions of the contact parts 285, 286, and 287 according to this calculation results. Furthermore, the central position calculation unit 87 calculates the position, on the panel surface 291, of the central axis AX3 of the input assistance device according to the results of calculation by the contact position calculation unit 86. The image processing unit 88 performs processing to change an image to be displayed on the sensor panel 290 to an image matching the position and range of the input assistance device, according to the result of calculation by the central position calculation unit 87. According to this processing result, the image display unit 89 causes the sensor panel 290 to display a certain image.

The rotational manipulation part 230 is supported by the bearing circular ring part 253 together with the joining axial part 240 and rotational top part 283, and is rotatable around the central axis AX3. In other words, the rotational manipulation part 230 is supported by the bearing circular ring part 253 used as a rotation support body so as to be rotatable around the central axis of the bearing circular ring part 253. When the rotational manipulation part 230 is rotated, the positions, on the panel surface 291, of the contact parts 285, 286, and 287 change. The plurality of detection electrodes 83 continuously detect these positional changes. According to this, the contact position calculation unit 86 continuously calculates the positions of the contact parts 285, 286, and 287. Then, it is possible to calculate information about the rotation of the rotational manipulation part 230 such as, for example, direction, angle, and speed. The calculation and control unit 84 uses the calculated information about the rotation as an input resulting from the rotational operation of the rotational manipulation part 230, and causes the sensor panel 290 to execute an operation and image display in correspondence to the input.

The elastic member S3 is placed between the rear surface 221b of the manipulation part 221 and the front surface 245 of the joining axial part 240. In a state in which a force is not applied to the pressing manipulation body 220 from the outside, a spacing between the rear surface 221b of the manipulation part 221 and the front surface 245 of the joining axial part 240 is kept constant due to the elastic force of the elastic member S3. As a result, an amount by which the contact body 224 extends from the rear surface 283b is smaller than an amount by which the contact parts 285, 286, and 287 protrude from the rear surface 283b, so the contact body 224 does not come into contact with the panel surface 291. By contrast, when the manipulation part 221 is pressed backward in the Z direction, the elastic member S3 is compressed and the contact body 224 comes close to the same side as the panel surface 291 or comes into contact with the panel surface 291. Since the pressing manipulation body 220 has conductivity, a change in capacitance occurs in the detection electrode 83 corresponding to the contact position or close position, on the panel surface 291, of the contact body 224, that is, the position of the central axis AX3 of the input assistance device. This change in capacitance is calculated by the capacitance measurement unit 85 according to the output from the detection electrode 83. According to this calculation result, the contact position calculation unit 86 calculates the contact position of the contact body 224. The calculation and control unit 84 determines, from this calculation result, that the pressing manipulation body 220 has been manipulated with the input assistance device attached to the panel surface 291 and that an input manipulation by the pressing manipulation body 220 has been performed, and causes the sensor panel 290 to execute an operation and image display in correspondence to this input manipulation.

As described above, the input system 210 in the second embodiment has a structure in which the base member 250 is joined to a pair of the rail members 281 and 282 fixed to the sensor panel 290 and the rotational part is supported by the bearing circular ring part 253 provided so as to be capable of being fixed to the base member 250 and removed from it. Accordingly, it is possible to easily and accurately move the rotational part along the rail members 281 and 282. After the base member 250 has been fixed, it is also possible to reliably place the rotational part at a desired position on the sensor panel 290.

Other operations and effects are similar to those in the first embodiment.

The present invention has been described with reference to the above embodiments, but the present invention is not limited to the above embodiments. It is possible to improve or change the present invention within the range of the object of improvement or the concept of the present invention.

As described above, the input assistance device and input system according to the present invention are useful in that an input resulting from a rotational operation can be accurately performed at a desired position.

What is claimed is:

1. An input assistance device for an input device including a sensor panel having a panel surface, the input assistance device comprising:
   a rotation support body having a central axis;
   an attachment mechanism that removably attaches the rotation support body to the panel surface so that the central axis is perpendicular to the panel surface; and
   a rotational part rotatably supported by the rotation support body so as to rotate around the central axis, the rotational part including:
      a side surface formed of a conductive material; and
      a bottom surface facing the panel surface, the bottom surface having at least one conductive area electrically connected to the side surface,
   wherein the attachment mechanism is a suction cup disposed on the bottom surface of the rotation support body, the suction cup adhering to the panel surface when the rotation support body is pressed against the panel surface along a direction of the central axis.

2. An input system comprising:
   the input assistance device according to claim 1; and
   the input device including the sensor panel having the panel surface, an input operation being performed according to a manipulation on the sensor panel.

3. The input system according to claim 2, wherein:
   the at least one conductive area includes a plurality of conductive areas provided along a circumference of a circle centered on the central axis; and
   the input device further includes:
      a position calculation unit that calculates positions of the plurality of conductive areas on the panel surface according to a result of detection by the sensor panel, and
      a central position calculation unit that calculates a position of the central axis according to a result of calculation by the position calculation unit.

4. The input system according to claim 3, wherein the input device further includes an image processing unit that changes an image to be displayed, according to the position of the central axis calculated by the central position calculation unit.

5. The input system according to claim 3, wherein the input assistance device is formed of a transparent material.

6. An input assistance device for an input device including a sensor panel having a panel surface, the input assistance device comprising:
   a rotation support body having a central axis, the rotation support body operating as a pressing manipulation body;
   an attachment mechanism that removably attaches the rotation support body to the panel surface so that the central axis is perpendicular to the panel surface;
   a rotational part rotatably supported by the rotation support body so as to rotate around the central axis, the rotational part including:
      a side surface formed of a conductive material; and
      a bottom surface facing the panel surface, the bottom surface having at least one conductive area electrically connected to the side surface; and
   an elastic member that provides an elastic force biasing the rotation support body away from the panel surface,
   wherein the rotation support body includes:
      a manipulation part having a front surface formed of a conductive material; and
      an axial part extending from the manipulation part along the central axis, the axial part providing conductivity from the front surface of the manipulation part to a bottom end of the axial part,
   wherein when the manipulation part is not being manipulated, the elastic force of the elastic member separates the bottom end of the axial part from the panel surface by a predetermined distance, and when the manipulation part is pressed toward the panel surface along the central axis, a distance between the bottom end of the axial part and the panel surface becomes shorter than the predetermined distance such that the bottom end of the axial part comes close to the panel surface or comes into contact with the panel surface,
   and wherein the attachment mechanism is a suction cup provided at the bottom end of the axial part, the suction cup adhering to the panel surface when the pressing manipulation body is pressed against the panel surface along the direction of the central axis.

7. An input system comprising:
   the input assistance device according to claim 6; and
   the input device including the sensor panel having the panel surface, an input operation being performed according to a manipulation on the sensor panel.

8. The input system according to claim 7, wherein:
   the at least one conductive area includes a plurality of conductive areas provided along a circumference of a circle centered on the central axis; and
   the input device further includes:
      a position calculation unit that calculates positions of the plurality of conductive areas on the panel surface according to a result of detection by the sensor panel, and
      a central position calculation unit that calculates a position of the central axis according to a result of calculation by the position calculation unit.

9. The input system according to claim 8, wherein the input device further includes an image processing unit that changes an image to be displayed, according to the position of the central axis calculated by the central position calculation unit.

10. The input system according to claim 8, wherein the input assistance device is formed of a transparent material.

11. An input assistance device for an input device including a sensor panel having a panel surface, the input assistance device comprising:
    a rotation support body having a central axis;
    an attachment mechanism that removably attaches the rotation support body to the panel surface so that the central axis is perpendicular to the panel surface;
    a rotational part rotatably supported by the rotation support body so as to rotate around the central axis, the rotational part including:
       a side surface formed of a conductive material; and
       a bottom surface facing the panel surface, the bottom surface having at least one conductive area electrically connected to the side surface,
    wherein the rotation support body is a bearing circular ring, and the attachment mechanism includes:
       a support member attached to the panel surface;
       a base member movably supported on the support member; and
       a fixing part for fixing and releasing the bearing circular ring to and from the base member, and wherein the rotational part includes:
- a rotational manipulation part rotatable around the central axis, the rotational part having a side surface formed of a conductive material;
- a joining axial part extending from the rotational manipulation part along the central axis, the joining axial part being rotatably supported by the bearing circular ring; and
- a rotational bottom part provided at an end of the joining axial part, the rotational bottom part having a bottom surface facing the panel surface, the bottom surface having at least one conductive area electrically connected to the side surface of the rotational manipulation part.

12. An input system comprising:
the input assistance device according to claim 11; and
the input device including the sensor panel having the panel surface, an input operation being performed according to a manipulation on the sensor panel.

13. The input system according to claim 12, wherein:
the at least one conductive area includes a plurality of conductive areas provided along a circumference of a circle centered on the central axis; and
the input device further includes:
- a position calculation unit that calculates positions of the plurality of conductive areas on the panel surface according to a result of detection by the sensor panel, and
- a central position calculation unit that calculates a position of the central axis according to a result of calculation by the position calculation unit.

14. The input system according to claim 13, wherein the input device further includes an image processing unit that changes an image to be displayed, according to the position of the central axis calculated by the central position calculation unit.

15. The input system according to claim 13, wherein the input assistance device is formed of a transparent material.

* * * * *